United States Patent
Yasuhiro et al.

(10) Patent No.: US 12,188,818 B2
(45) Date of Patent: Jan. 7, 2025

(54) SPECTROMETER, METROLOGY SYSTEM, AND SEMICONDUCTOR INSPECTION METHOD

(71) Applicant: Samsung Electronics Co., Ltd., Suwon-si (KR)

(72) Inventors: Hidaka Yasuhiro, Yokohama (JP); Jinyong Kim, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 17/827,051

(22) Filed: May 27, 2022

(65) Prior Publication Data

US 2022/0404197 A1 Dec. 22, 2022

(30) Foreign Application Priority Data

Jun. 18, 2021 (JP) .................................. 2021-101823
Jan. 28, 2022 (KR) ......................... 10-2022-0013618

(51) Int. Cl.
*G01J 3/02* (2006.01)
*G01J 3/28* (2006.01)
*H01L 21/66* (2006.01)

(52) U.S. Cl.
CPC ........... *G01J 3/0208* (2013.01); *G01J 3/2823* (2013.01); *H01L 22/12* (2013.01)

(58) Field of Classification Search
CPC .............................. G01J 3/0208; G01J 3/2823
See application file for complete search history.

(56) References Cited

U.S. PATENT DOCUMENTS

| | | | |
|---|---|---|---|
| 4,575,243 A | 3/1986 | Witte | |
| 5,061,049 A | 10/1991 | Hornbeck | |
| 5,504,575 A * | 4/1996 | Stafford | G01J 3/28 356/330 |
| 6,870,619 B1 * | 3/2005 | Tenhunen | G01J 3/28 356/330 |
| 6,882,775 B1 * | 4/2005 | Peng | G02B 6/29311 385/36 |
| 7,256,885 B2 | 8/2007 | Silberberg et al. | |
| 2006/0262304 A1 * | 11/2006 | Carron | G01J 3/02 356/328 |
| 2007/0296969 A1 | 12/2007 | Goldstein et al. | |
| 2009/0220192 A1 | 9/2009 | Presley et al. | |

(Continued)

FOREIGN PATENT DOCUMENTS

CN 105628200 B * 8/2017
EP 2165169 A1 3/2010

(Continued)

*Primary Examiner* — Uzma Alam
*Assistant Examiner* — Mohamed Doumbia
(74) *Attorney, Agent, or Firm* — Harness, Dickey & Pierce, P.L.C.

(57) ABSTRACT

A spectrometer and a metrology system capable of improving spectral performance are provided. The spectrometer includes a collimator lens, a focusing lens, and a spatial light modulator (SLM), wherein light reflected by the SLM is output from an output slit through the focusing lens and a dispersive optical element, and on a second plane perpendicular to a first plane including optical paths of pieces of light dispersed at different angles, an incident slit, the output slit, and a reflective plane have a conjugate relationship.

20 Claims, 29 Drawing Sheets

(56) References Cited

U.S. PATENT DOCUMENTS

| | | |
|---|---|---|
| 2009/0220233 A1 | 9/2009 | Presley et al. |
| 2010/0245818 A1 | 9/2010 | Viard et al. |
| 2014/0268127 A1* | 9/2014 | Day ..................... G01J 3/0229 |
| | | 359/291 |
| 2015/0260920 A1 | 9/2015 | Ohtsuka |
| 2018/0052099 A1 | 2/2018 | Hill et al. |
| 2018/0292326 A1 | 10/2018 | Manassen et al. |
| 2019/0008390 A1* | 1/2019 | Wong ................. G01B 9/02091 |
| 2019/0128741 A1 | 5/2019 | Takahashi et al. |
| 2022/0137160 A1 | 5/2022 | Sekiya et al. |

FOREIGN PATENT DOCUMENTS

| | | | |
|---|---|---|---|
| EP | 3438625 A1 | 2/2019 | |
| JP | 2000-056244 A | 2/2000 | |
| JP | 2009-276747 A | 11/2009 | |
| JP | WO2014-061102 A1 | 9/2016 | |
| JP | 2017-181259 A | 10/2017 | |
| JP | 2021085698 A * | 6/2021 | ............ G01B 11/00 |
| JP | 2022-072599 A | 5/2022 | |
| WO | WO-2009-007054 A1 | 1/2009 | |
| WO | WO-2014-061102 A1 | 4/2014 | |
| WO | WO-2017-169800 A1 | 10/2017 | |

\* cited by examiner

CUT PLANE LINE OF DMD SUBSTRATE SURFACE//
CUT PLANE LINE OF MIRROR SURFACE⊥MAIN LIGHT BEAM OF INCIDENT LIGHT

CUT PLANE LINE OF DMD SUBSTRATE SURFACE//
CUT PLANE LINE OF MIRROR SURFACE⊥MAIN LIGHT BEAM OF INCIDENT LIGHT

CUT PLANE LINE OF DMD SUBSTRATE SURFACE//
CUT PLANE LINE OF MIRROR SURFACE⊥MAIN LIGHT BEAM OF INCIDENT LIGHT

SPECTROMETER, METROLOGY SYSTEM, AND SEMICONDUCTOR INSPECTION METHOD

CROSS-REFERENCE TO RELATED APPLICATIONS

This application claims the benefit of Japanese Patent Application No. 2021-101823, filed on Jun. 18, 2021, in the Japanese Patent Office and Korean Patent Application No. 10-2022-0013618, filed on Jan. 28, 2022, in the Korean Intellectual Property Office, the disclosures of which are incorporated herein in their entireties by reference.

BACKGROUND

The inventive concepts relate to a spectrometer, a metrology system, and/or a semiconductor inspection method.

In a semiconductor manufacturing process, an optical measuring instrument using spectroscopic reflectometry (SR), spectroscopic ellipsometry (SE), and the like has been popularly used. The optical measuring instrument may measure a dimension, such as a layer thickness, of a semiconductor circuit structure formed on a silicon substrate or an optical constant, such as a refractive index, with a high degree of precision. The optical measuring instrument is referred to as an optical critical dimension (OCD) measuring apparatus and calculates a dimension of a semiconductor circuit structure or an optical constant of a constituent material by comparing and fitting a measuring result to a simulation result using a model of the semiconductor circuit structure.

For the recent 10 years, like a fin-shaped field-effect transistor (FinFET) of a logic semiconductor device, three-dimensional (3D)-NAND flash memory of a memory semiconductor device, and like, a semiconductor circuit structure has been more complex by being 3D. As a structure of a required target is complex, the number of floating parameters increases by fitting. For example, in existing metrology on a FinFET by an OCD measuring apparatus, about 20 to about 30 parameters may be needed.

When fit to a model, to obtain a value of a dimension, it may be needed to obtain a greater number of measurement values than at least the number of floating parameters. For example, SR requires a reflectance spectrum, and SE requires a spectrum of $\Psi$ and a spectrum of $\Delta$. In model fitting, there is a coupling problem that fitting is converged by a combination of floating parameters different from actual dimensions. To avoid coupling, SR or SE may be frequently performed on 100 or more wavelengths. Regardless of these requirements of metrology precision, it is required to take a very short time for OCD metrology in a semiconductor manufacturing process. For example, a measuring time allowed per wafer is at most tens of seconds, and accordingly, metrology is limited to a very small part of the wafer.

Metrology of a plurality of wavelengths in an OCD measuring apparatus is largely classified as two types. One is a method of passing, through a monochromator, light output from a light source and emitting monochromatic light. The other one is a method of inputting, to a spectrometer, light reflected by emitting light of a wide wavelength band, and performing metrology for each wavelength of spectrally dispersed light. Spectrometry using a spectrometer enables high-speed metrology because multiple wavelengths may be simultaneously measured, but a monochromator may also be frequently required due to causes, such as image metrology of a wide field of vision, a reflectance on a pupil, ellipsometry metrology, and the like.

In general, a monochromator is configured to rotate a diffraction grating or a dispersion prism, and wavelength conversion requires tens of msec or more according to a time used for acceleration or deceleration of a rotary stage. When the number of converted wavelengths is 100 or more, a time of several seconds or more is required only for the conversion, and thus, the conversion is a very big reduction factor for a total throughput of an OCD measuring apparatus.

SUMMARY

It has been known in a spectrometer using a reflective spatial light modulator (SLM) (e.g., a digital micromirror device (DMD)), the surface of the SLM is inclined to extract spectrally dispersed light. This feature is validated if each pixel mirror on the SLM is parallel to the surface of the SLM. However, in an element having a micromirror array (MMA) structure, including a DMD, capable of operating at a high speed or spectrally dispersing light in a wide wavelength range, each pixel mirror is inclined with respect to the entire surface of the DMD in both cases of ON and OFF. Accordingly, light incident to the DMD is not reflected toward a focusing optical system. In addition, when a DMD is obliquely arranged so that the surface of each pixel mirror of the DMD is perpendicular to an optical axis of a focusing optical system, light is reflected toward the focusing optical system. However, because light dispersed out of the vicinity of the center of a DMD is out of focus in this arrangement, spectral performance cannot be improved due to out-of-focus at positions excluding the vicinity of the center of the DMD.

The inventive concepts provide a spectrometer and/or a metrology system capable of improving use efficiency of light and improving spectral performance.

According to an aspect of the present disclosure, a spectrometer includes a collimator lens configured to generate parallel pieces of light by collimating light that has passed through an incident slit. A dispersive optical element is configured to generate dispersed pieces of light by dispersing the parallel pieces of light at different angles according to wavelengths. A focusing lens is configured to generate focused light by focusing the dispersed pieces of light. A spatial light modulator has a reflective plane configured to generate reflective light by reflecting the focused light focused by the focusing lens, wherein the reflective light is output through an output slit by passing by the focusing lens and the dispersive optical element. The incident slit, the output slit, and the reflective plane have a conjugate relationship on a second plane perpendicular to a first plane. The first plane includes optical paths of the dispersed pieces of light, and the second plane includes an optical axis of the collimator lens and an optical axis of the focusing lens.

According to another aspect of the present disclosure, a metrology system includes a spectrometer configured to generate inspection light. A semiconductor metrology device is configured to inspect a semiconductor by using the inspection light output from the spectrometer. The spectrometer includes a collimator lens configured to generate parallel pieces of light by collimating light that has passed through an incident slit. A dispersive optical element is configured to generate dispersed pieces of light by dispersing the parallel pieces of light at different angles according to wavelengths. A focusing lens is configured to generate focused light by focusing the dispersed pieces of light and a spatial light modulator is configured to generate reflective light by reflecting the light focused by the focusing lens. The spatial light modulator includes a substrate having a plate shape and a plurality of pixel mirrors in a matrix form on a substrate surface of the substrate, wherein a normal of the substrate surface is parallel to an optical axis of the focusing lens. A mirror surface of each of the plurality of pixel mirrors is oblique with respect to the substrate surface, and an optical axis of the collimator lens is oblique with respect to the optical axis of the focusing lens.

According to yet another aspect of the present disclosure, a spectrometer includes a collimator lens configured to generate parallel pieces of light by collimating light that has passed through an incident slit. A dispersive optical element is configured to generate dispersed pieces of light by dispersing the parallel pieces of light at different angles according to wavelengths. A focusing lens is configured to generate focused light by focusing the dispersed pieces of light. A digital micromirror device is configured to generate reflective light by reflecting the light focused by the focusing lens. The digital micromirror device includes a substrate having a plate shape and a plurality of pixel mirrors in a matrix form on a substrate surface of the substrate, wherein each of the plurality of pixel mirrors includes a mirror surface reflecting the light and a rotary axis extending in a dispersion direction of the dispersive optical element.

According to a still further aspect of the present disclosure, a semiconductor inspection method includes generating inspection light by using a spectrometer including a dispersive optical element, a focusing lens, and a digital micromirror device and emitting the inspection light on a semiconductor and detecting the inspection light reflected from the semiconductor. The digital micromirror device includes a substrate having a plate shape; and a plurality of pixel mirrors arranged in a matrix form on a substrate surface of the substrate. Each of the plurality of pixel mirrors comprises a mirror surface reflecting focused light focused by the focusing lens and a rotary axis extending in a dispersion direction of the dispersive optical element, and the generating the inspection light comprises adjusting the inspection light to have a configured wavelength band by configuring an extraction wavelength column including pixel mirrors arranged in a first direction perpendicular to the dispersion direction among the plurality of pixel mirrors.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
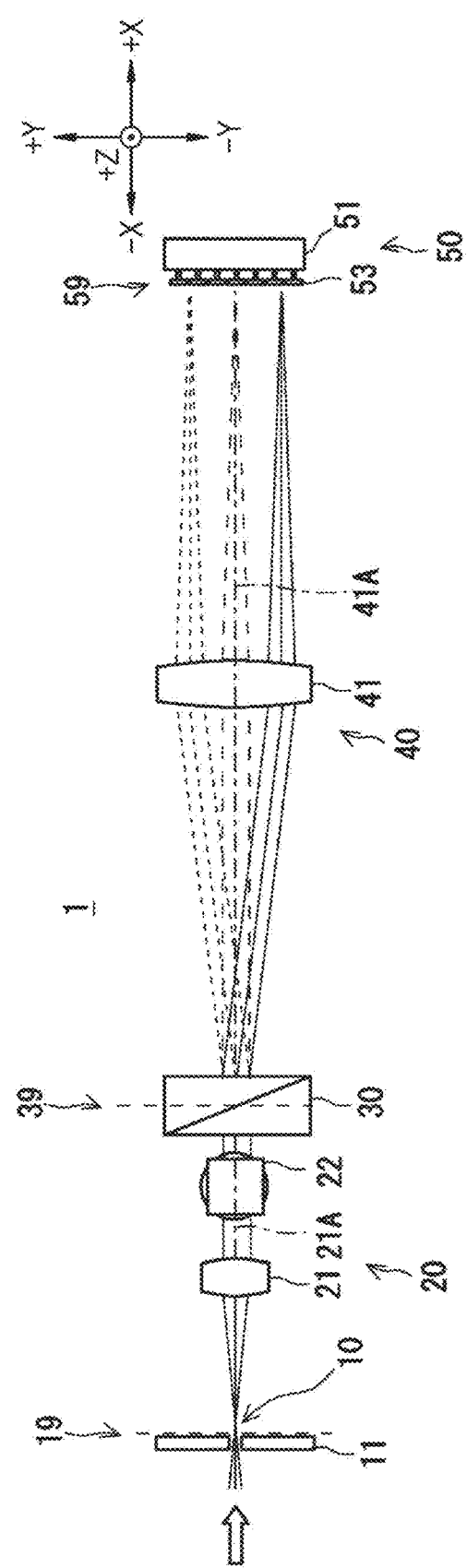
FIG. 1 illustrates a spectrometer according to example embodiment 1.

For clearness of description, descriptions and drawings below are properly omitted and simplified. In addition, in each drawing, like reference numerals denote like elements, and a repeated description is omitted in accordance with circumstances.

Embodiment 1

A spectrometer 1 according to example embodiment 1 is described. The spectrometer 1 according to embodiment 1 is a spectrometer (monochromator) used in, for example, a semiconductor metrology device such as a semiconductor inspection device or a semiconductor measurement device, to convert a wavelength of light. Particularly, the spectrometer 1 is used for an optical inspection device or an optical measurement device to measure a dimension, distortion, or a physical property value of a circuit structure formed on a sample, such as a semiconductor wafer, or detect a defect in a semiconductor manufacturing process. In addition, the spectrometer 1 according to embodiment 1 may be used for others than the semiconductor metrology device.

Figure 2:
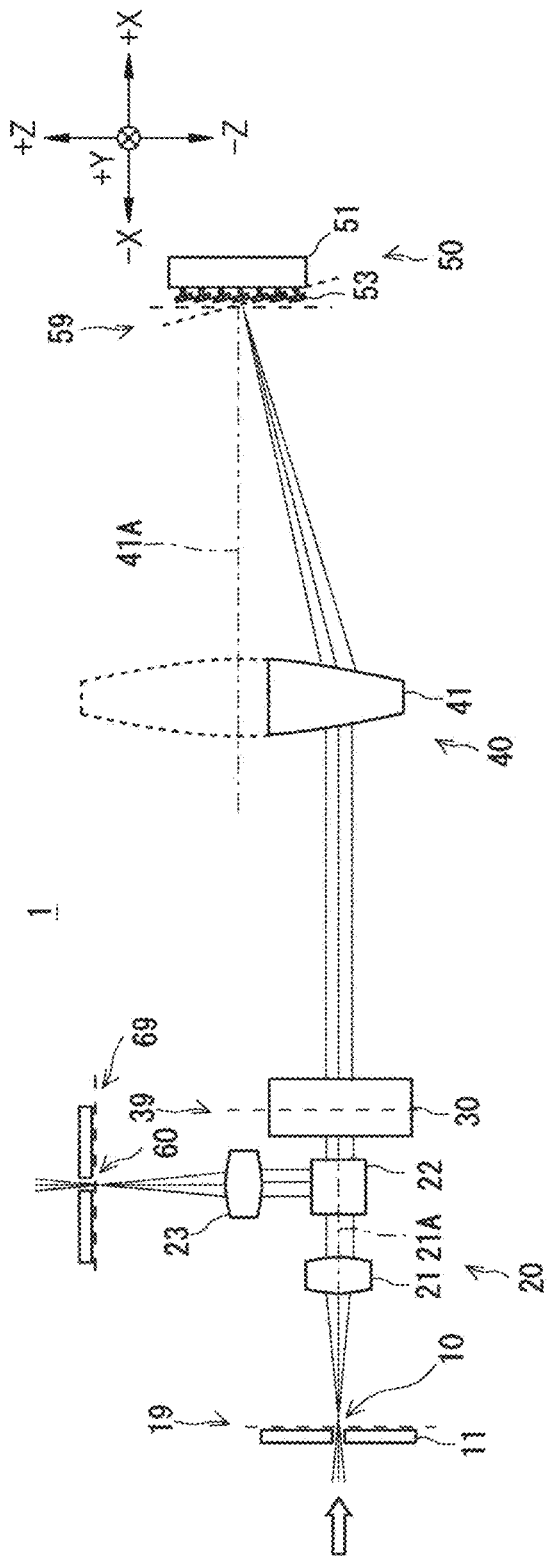
FIG. 2 illustrates the spectrometer according to example embodiment 1.

FIGS. 1 and 2 illustrate the spectrometer 1 according to example embodiment 1. Herein, for convenience of description of the spectrometer 1, an XYZ orthogonal coordinate system is introduced. An XY plane denotes a plane including light dispersed by a dispersive optical element, to be described below, at different angles according to wavelengths. FIG. 1 illustrates an arrangement of each component on the XY plane viewed in a −Z-axis direction (i.e., perpendicular to a Z axis). FIG. 2 illustrates an arrangement of each component on an XZ plane viewed in a +Y-axis direction (i.e., perpendicular to a Y axis). A real line, a broken line, and a dashed line in FIG. 1 are used to discriminate pieces of light of different wavelengths from each other.

Although the drawings show a +X-axis direction, the +Y-axis direction, a +Z-axis direction, a −X-axis direction, a −Y-axis direction, and the −Z-axis direction, for convenience of description, the ±X-axis directions may be simply referred to as an X-axis direction, the ±Y-axis directions may be simply referred to as a Y-axis direction, and the ±Z-axis directions may be simply referred to as a Z-axis direction.

As shown in FIGS. 1 and 2, the spectrometer 1 may include an incident slit 10, a collimator optical system 20, a dispersive optical element 30, a focusing optical system 40, a digital micromirror device (DMD) 50, and an output slit 60. The spectrometer 1 includes the DMD 50 that is a reflective spatial light modulator (SLM). In addition, the spectrometer 1 is not limited to the DMD 50 as the reflective SLM and may include an SLM using a liquid crystal.

An incident slit plate 11 may include the incident slit 10. In addition, the incident slit 10 may be a cross-sectional output hole of a fiber guiding light. The incident slit 10 passes therethrough light generated by a light source and guides the light to the collimator optical system 20.

The collimator optical system 20 may include, for example, a collimator lens 21, a beam splitter 22, and a collimator lens 23. The collimator lens 21 converts, into parallel pieces of light, light that has passed through the incident slit 10. The parallel pieces of light generated by the collimator lens 21 are incident to the beam splitter 22.

In an outward path of light in the +X-axis direction, the beam splitter 22 transmits therethrough some of the incident parallel pieces of light and guides the transmitted pieces of light to the dispersive optical element 30. In addition, in a return path of light in the −X-axis direction, the beam splitter 22 reflects, toward the collimator lens 23, some of pieces of light that have transmitted through the dispersive optical element 30. The collimator lens 23 concentrates the pieces of light reflected by the beam splitter 22 and allows the concentrated light to pass through the output slit 60.

The dispersive optical element 30 disperses light. Particularly, the dispersive optical element 30 disperses, at different angles according to wavelengths, the parallel pieces of light converted by the collimator lens 21. The parallel pieces of light dispersed by the dispersive optical element 30 may be alternatively referred to as dispersed pieces of light.

That is, the dispersive optical element 30 disperses light at a different angle for each wavelength. The dispersive optical element 30 may include a diffraction grating or a prism. The dispersive optical element 30 may disperse the pieces of light that have transmitted through the beam splitter 22 so that the pieces of light that have transmitted through the beam splitter 22 travel at different angles according to wavelengths like the dashed line, the broken line, and the real line of FIG. 1. That is, in FIG. 1, the dashed line, the broken line, and the real line indicate paths of pieces of light of different wavelengths, respectively. The Y-axis direction in which the dispersive optical element 30 disperses light is referred to as a dispersion direction.

The focusing optical system 40 includes a focusing lens 41. The focusing lens 41 concentrates the dispersed pieces of light. For example, in FIG. 1, in the XY plane including the dispersion direction, the focusing lens 41 may be arranged so that the dispersive optical element 30 is located at a focal position of the focusing lens 41 in the −X-axis direction. The focusing lens 41 may be arranged so that the DMD 50 is located at a focal position of the focusing lens 41 in the +X-axis direction. In other words, the dispersive optical element 30 is located at the focal position of the focusing lens 41 in the −X-axis direction, and the DMD 50 may be located at the focal position of the focusing lens 41 in the +X-axis direction. Accordingly, in the XY plane, images of the incident slit 10, which are dispersed according to wavelengths, are formed on the DMD 50.

In addition, as shown in FIG. 2, in the XZ plane, an optical axis 41A of the focusing lens 41 is shifted from and parallel to an optical axis 21A of the collimator lens 21. For example, the optical axis 41A of the focusing lens 41 is shifted in the +Z-axis direction from the optical axis 21A and the collimator lens 21. That is, an extension line of the optical axis 41A of the focusing lens 41 and an extension line of the optical axis 21A and the collimator lens 21 may be separated from each other in one direction (e.g., the ±Z-axis direction). The DMD 50 may be on the optical axis 41A of the focusing lens 41.

In FIG. 2, the focusing lens 41 has a shape in which a part of a full lens is cut out. A shape of the cut-out part is marked with a dashed line. Whether the focusing lens 41 actually has a cut shape may be determined according to a product specification. The dispersed pieces of light that have transmitted through the dispersive optical element 30 may be concentrated on a point of intersection between the optical axis 41A of the focusing lens 41 and the DMD 50. That is, the focusing lens 41 may generate focused light based on the dispersed pieces of light. Accordingly, a main light beam (a central axis of light) may be oblique with respect to the optical axis 41A of the focusing lens 41.

As shown in FIG. 1, in the XY plane including the dispersion direction, wavelength-specific images of the incident slit 10, to which light is incident, are formed on the DMD 50. Pieces of light reflected from the DMD 50 offset wavelength dispersion by transmitting through the same dispersive optical element 30 again. Therefore, an image of the incident slit 10 is formed at the same position regardless of wavelengths (i.e., the same position for each of pieces of light of different wavelengths). Therefore, the output slit 60 is arranged at the position where the image of the incident slit 10 is formed. As shown in FIG. 2, in the XZ plane perpendicular to the dispersion direction, the DMD 50 is arranged on the optical axis 41A of the focusing lens 41, which is shifted from the optical axis 21A of the collimator lens 21.

A dispersion plane, i.e., the XY plane including optical paths of pieces of light dispersed at different angles, is defined as a first plane. The XZ plane including the optical axis 21A of the collimator lens 21 and the optical axis 41A of the focusing lens 41 and perpendicular to the first plane is defined as a second plane. When the first plane and the second plane are defined as described above, on the second plane, a plane 19 of the incident slit 10, a plane 69 of the output slit 60, and a reflective plane 59 of the DMD 50 have a conjugate relationship with respect to an optical system of the spectrometer 1. In addition, the dispersive optical element 30 is arranged at a pupil position 39.

Figure 3:
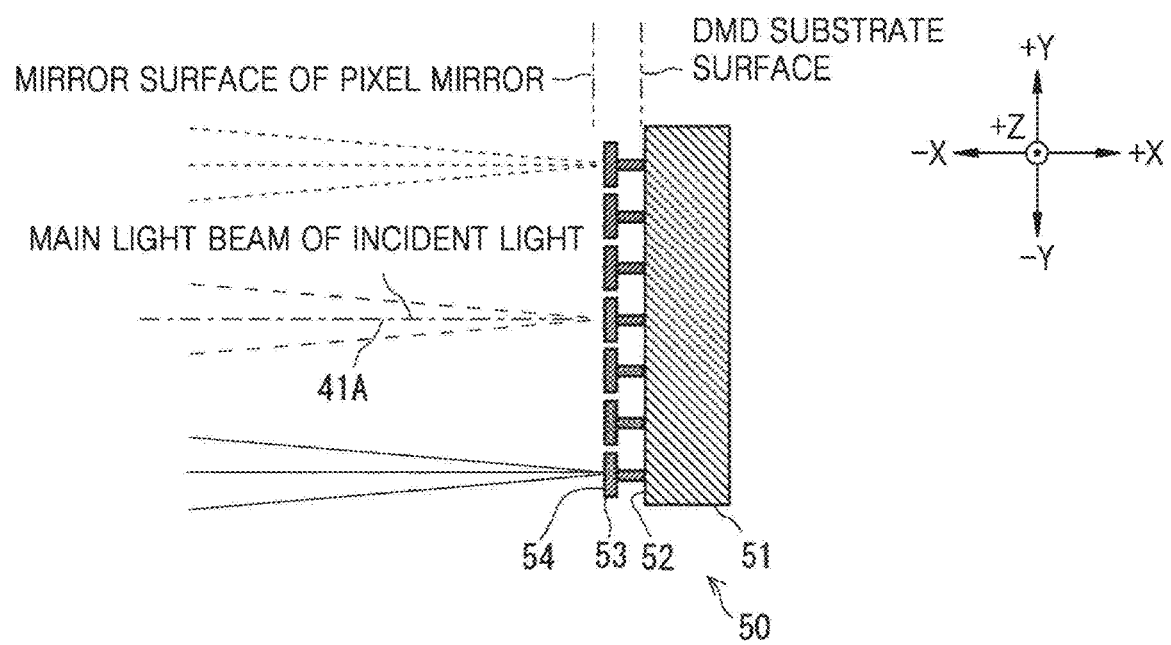
FIG. 3 is a cross-sectional view of a digital micromirror device (DMD) in the spectrometer according to example embodiment 1.
Figure 4:
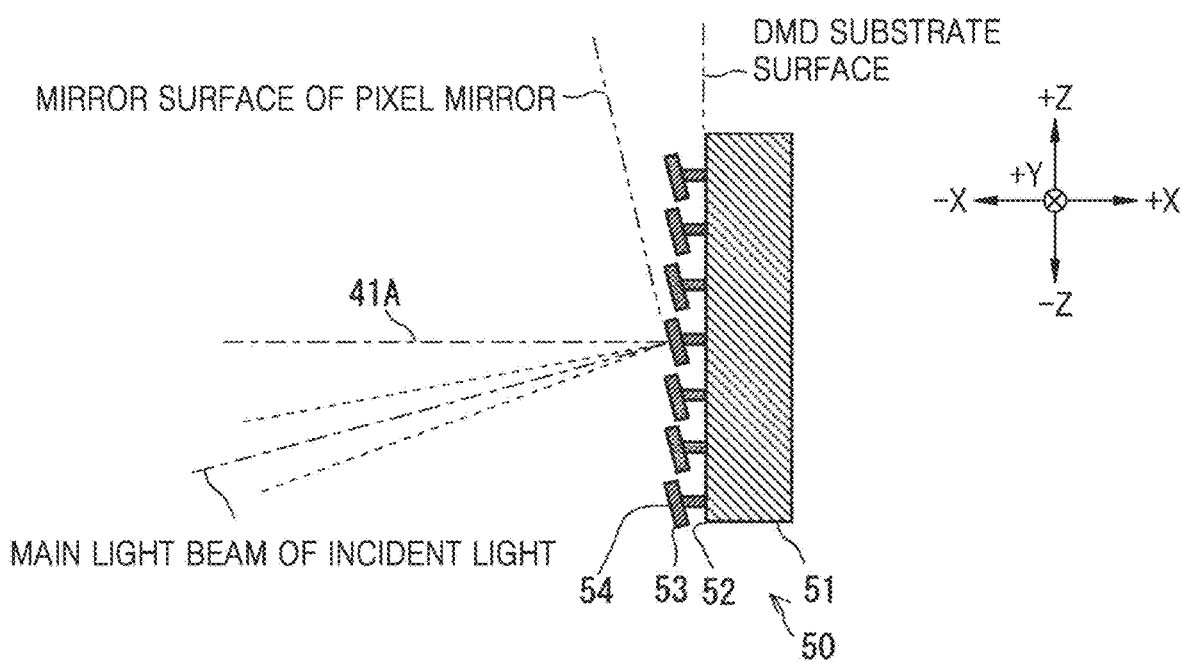
FIG. 4 is a cross-sectional view of the DMD in the spectrometer according to example embodiment 1.
Figure 5:
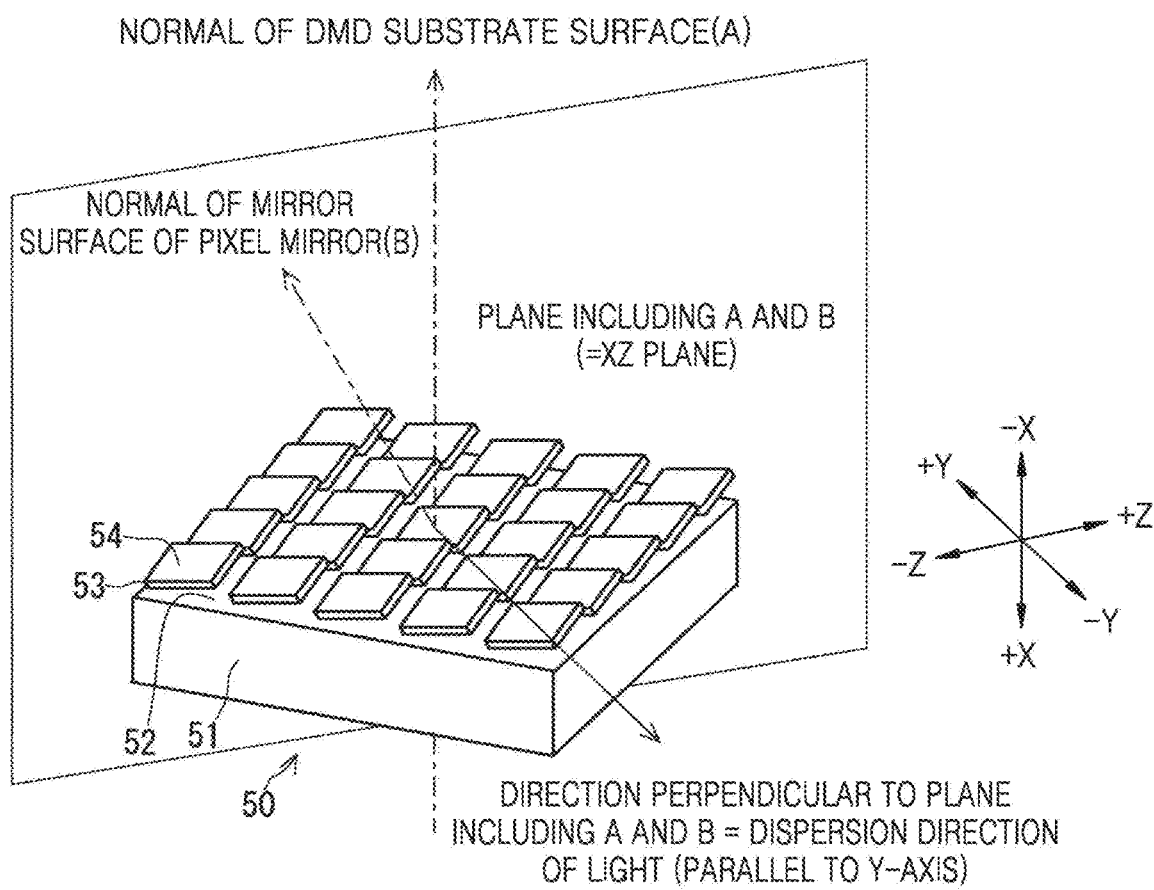
FIG. 5 is a perspective view of the DMD in the spectrometer according to example embodiment 1.
Figure 6:
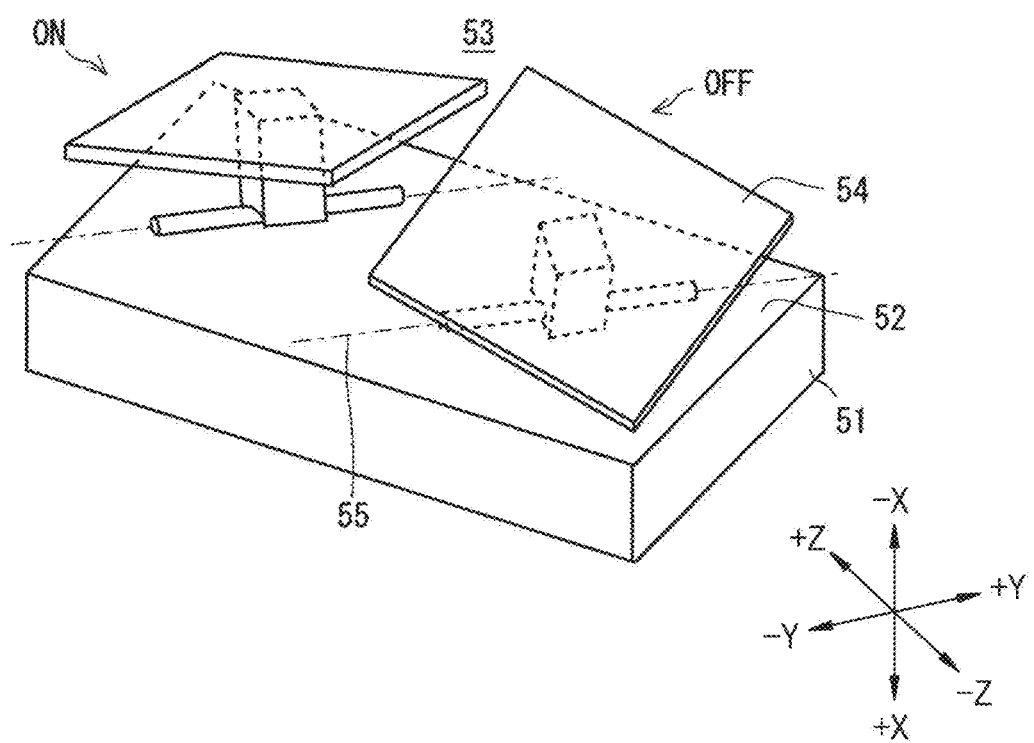
FIG. 6 is a perspective view of pixel mirrors of the DMD in the spectrometer according to example embodiment 1.
Figure 7:
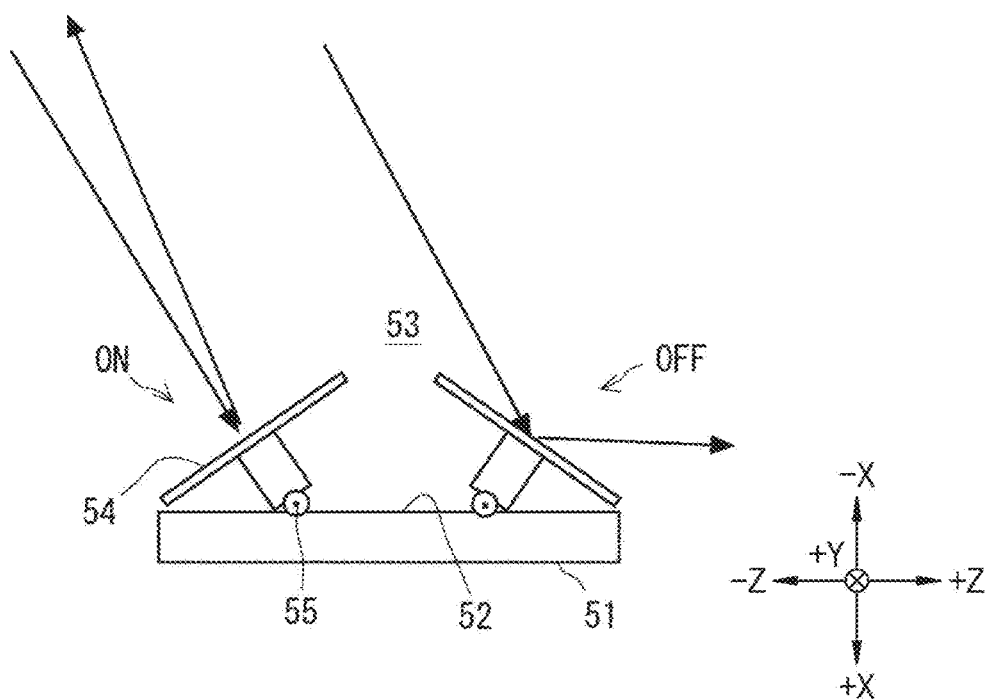
FIG. 7 is a cross-sectional view illustrating the pixel mirrors of the DMD in the spectrometer according to example embodiment 1 and shows a cross-section perpendicular to rotary axes of the pixel mirrors.

FIGS. 3 and 4 are cross-sectional views illustrating the DMD 50 in the spectrometer 1 according to example embodiment 1. FIG. 3 is a cross-sectional view of the DMD 50, which is perpendicular to the Z-axis direction. FIG. 4 is a cross-sectional view of the DMD 50, which is perpendicular to the Y-axis direction. FIG. 5 is a perspective view of the DMD 50 in the spectrometer 1 according to embodiment 1. FIG. 6 is a perspective view illustrating pixel mirrors 53 of the DMD 50 in the spectrometer 1 according to embodiment 1. FIG. 7 is a cross-sectional view illustrating pixel mirrors 53 of the DMD 50 in the spectrometer 1 according to embodiment 1 and shows a cross-section perpendicular to rotary axes 55 of the pixel mirrors 53.

As shown in FIGS. 3 to 5, the DMD 50 has a reflective plane from which light focused by the focusing lens 41 is reflected. The DMD 50 may include a plate-shaped substrate 51 and a plurality of pixel mirrors 53. A substrate surface 52 is a surface of the substrate 51 in the −X-axis direction. The plurality of pixel mirrors 53 may be arranged in a matrix form on the substrate surface 52 of the substrate 51. Each of the plurality of pixel mirrors 53 has a mirror surface 54 from which light is reflected. Therefore, the mirror surface 54 is a reflective plane of each of the plurality of pixel mirrors 53, from which light focused by the focusing lens 41 is reflected.

As shown in FIG. 3, on a cross-section of the XY plane including the dispersion direction, the substrate surface 52 (for example, a cutting plane line thereof) of the substrate 51 is parallel to the mirror surface 54 (for example, a cutting plane line thereof) of each of the plurality of pixel mirrors 53. The substrate surface 52 (for example, a cutting plane line thereof) and the mirror surface 54 (for example, a cutting plane line thereof) are substantially perpendicular to a main light beam of incident light (i.e., a central axis of light). By this arrangement, on the XY plane, focuses of pieces of light of all dispersed wavelengths are on the mirror surface 54. Therefore, spectral performance may be improved.

In addition, as shown in FIG. 4, in a cross-section of the XZ plane perpendicular to the dispersion direction, the substrate surface 52 of the substrate 51 is perpendicular to the optical axis 41A of the focusing lens 41. The mirror surface 54 of each of the plurality of pixel mirrors 53 is perpendicular to a main light beam of incident light (i.e., a central axis of light). Therefore, on the XZ plane, a central axis of light incident to the DMD 50 is perpendicular to the mirror surface 54. By this arrangement, in the XZ plane, focuses of pieces of light of all dispersed wavelengths are on the mirror surface 54. Therefore, light use efficiency and spectral performance may be improved.

As shown in FIGS. 6 and 7, each of the plurality of pixel mirrors 53 may have a rotary axis 55. The rotary axis 55 may extend in, for example, the Y-axis direction. Therefore, the rotary axis 55 may extend in the dispersion direction. Each of the plurality of pixel mirrors 53 rotates around the rotary axis 55. Mirror surfaces 54 of the plurality of pixel mirrors 53 make certain angles with respect to the substrate surface 52 and the substrate 51. For example, each pixel mirror 53 has an ON state in which the mirror surface 54 is inclined at a certain first angle with respect to the substrate surface 52 or an OFF state in which the mirror surface 54 is inclined at a certain second angle with respect to the substrate surface 52. As described above, each pixel mirror 53 may switch to two states. However, the mirror surface 54 of each pixel mirror 53 is not parallel to the substrate surface 52 of the substrate 51 of the DMD 50 in both the ON state and the OFF state.

As shown in FIGS. 5 to 7, in each of the ON state and the OFF state, a plane (i.e., the XZ plane) including a normal of each mirror surface 54 and a normal of the substrate surface 52 of the substrate 51 is perpendicular to the dispersion direction of light by the dispersive optical element 30. According to this configuration, the entire surface of the DMD 50 has a conjugate relationship with the incident slit 10, and thus, wavelength resolution may be increased, and light use efficiency may be improved.

When the spectrometer 1 is used in a semiconductor metrology device, for example, only pixel mirrors 53 corresponding to pieces of light of wavelengths to be used in the semiconductor metrology device among the plurality of pixel mirrors 53 of the DMD 50 are in the ON state. In addition, reflective pieces of light reflected from the pixel mirrors 53 in the ON state return back to the focusing optical system 40. For example, the DMD 50 configures an extraction wavelength column including a plurality of pixel mirrors 53 in the Z-axis direction. The Z-axis direction is perpendicular to the dispersion direction.

Figure 8:
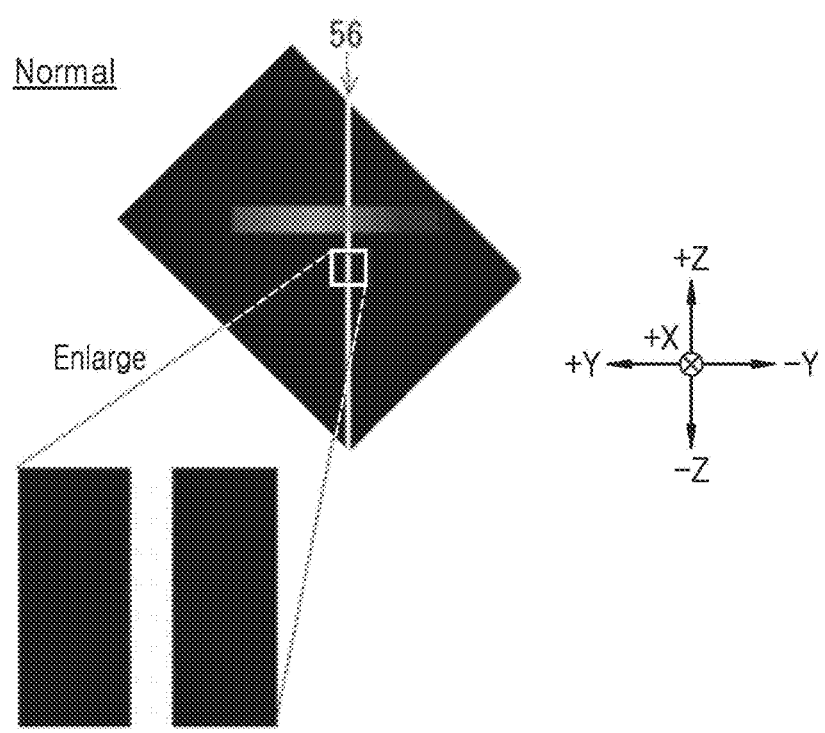
FIG. 8 illustrates images of an incident slit, which are formed on the DMD and have different positions according to wavelengths, in the spectrometer according to example embodiment 1.
Figure 9:
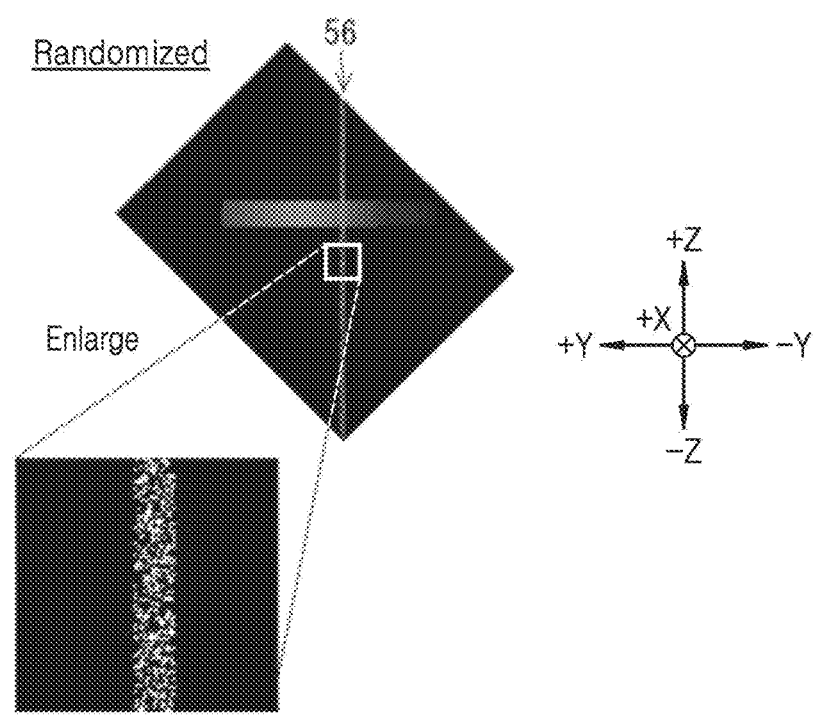
FIG. 9 illustrates images of an incident slit, which are formed on the DMD and have different positions according to wavelengths, in the spectrometer according to example embodiment 1.

FIGS. 8 and 9 illustrate images of the incident slit 10, which are formed on the DMD and have different positions according to wavelengths, in the spectrometer 1 according to example embodiment 1. In FIGS. 8 and 9, a white part indicates pixel mirrors 53 of an extraction wavelength column 56, and a black part indicates pixel mirrors 53 excluding the extraction wavelength column 56. The DMD 50 may output light including a certain wavelength band through the output slit 60 by switching each pixel mirror 53 of the extraction wavelength column 56 to the ON state. In addition, the DMD 50 may configure a plurality of extraction wavelength columns 56. In addition, the DMD 50 may output pieces of light including a plurality of wavelength bands through the output slit 60 by switching each pixel mirror 53 of the plurality of extraction wavelength columns 56 to the ON state.

In addition, as shown in FIG. 8, when a white laser, such as a supercontinuum laser (hereinafter, referred to as an SC laser), is used, the white laser may cause a light intensity distribution in a shape of particles, called speckles, due to high spatial coherency. Therefore, as shown in FIG. 9, the DMD 50 randomly switches each pixel mirror 53 of the extraction wavelength column 56 to the ON state or the OFF state. As described above, in a used wavelength band, when a plurality of pixel mirrors 53 are randomly switched to the ON state or the OFF state, speckles may be reduced. The DMD 50 switches a plurality of pixel mirrors 53 excluding the extraction wavelength column 56 to the OFF state.

Light reflected from the DMD 50 is output from the output slit 60 through the focusing lens 41 and the dispersive optical element 30. More particularly, light reflected from the DMD 50 is output from a monochromator by transmitting through the focusing lens 41 and the dispersive optical element 30 and passing through the beam splitter 22 and the collimator lens 23 of the collimator optical system 20 and the output slit 60. As described above, the spectrometer 1 according to embodiment 1 may include a retro arrangement.

COMPARATIVE EXAMPLE

Figure 10:
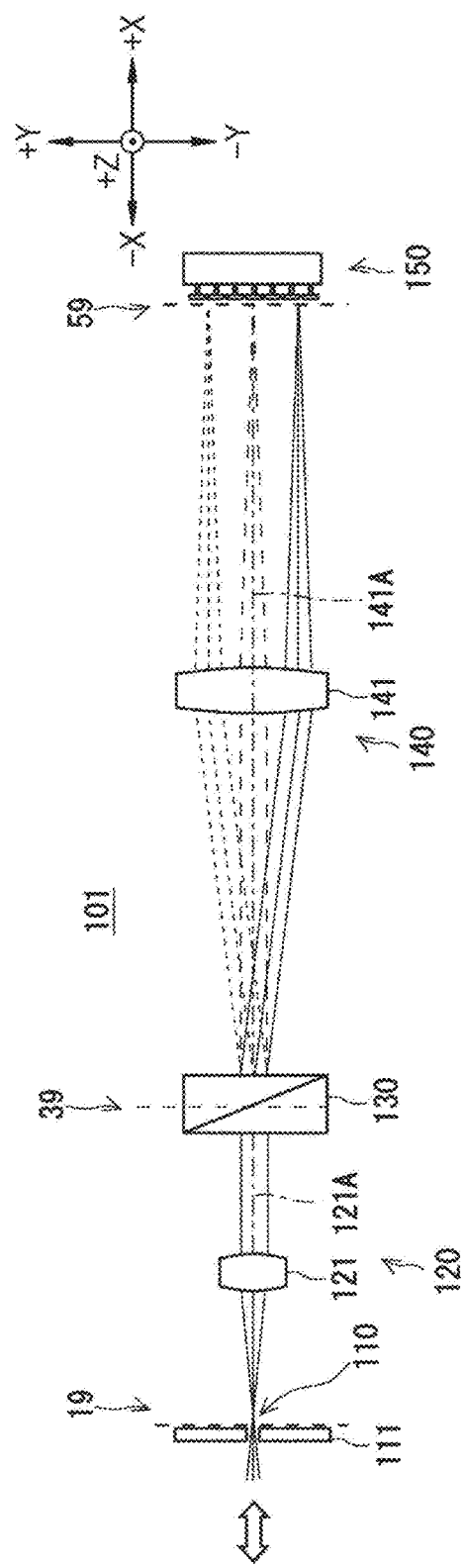
FIG. 10 illustrates a spectrometer according to a comparative example.
Figure 11:
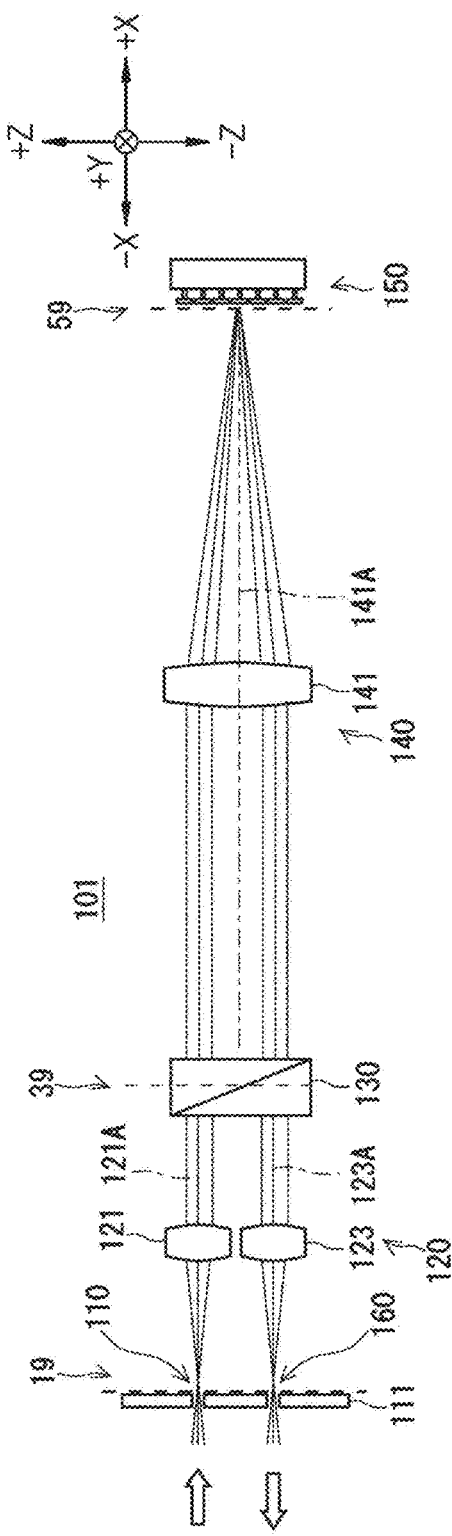
FIG. 11 illustrates the spectrometer according to the comparative example.

Next, a spectrometer 101 according to a comparative example is described. FIGS. 10 and 11 illustrate the spectrometer 101 according to the comparative example. As shown in FIGS. 10 and 11, the spectrometer 101 according to the comparative example may include an incident slit 110, a collimator optical system 120, a dispersive optical element 130, a focusing optical system 140, an SLM 150, and an output slit 160. The incident slit 110 passes therethrough light generated by a light source and guides the light to the collimator optical system 120.

The collimator optical system 120 may include a collimator lens 121 and a collimator lens 123. The collimator lens 121 converts, into parallel pieces of light, light that has passed through the incident slit 110. The parallel pieces of light converted by the collimator lens 121 are incident to the dispersive optical element 130.

The dispersive optical element 130 disperses, at different angles according to wavelengths, the parallel pieces of light converted by the collimator lens 121.

The focusing optical system 140 includes a focusing lens 141. For example, in FIG. 10, in the XY plane including the dispersion direction, the focusing lens 141 may be arranged so that the dispersive optical element 130 is located at a focal position of the focusing lens 141 in the −X-axis direction. The focusing lens 141 may be arranged so that the SLM 150 is located as a focal position of the focusing lens 141 in the +X-axis direction. Accordingly, in the XY plane, images of the incident slit 110, which are dispersed according to wavelengths, are formed on the SLM 150.

In addition, as shown in FIG. 11, in the XZ plane, an optical axis 141A of the focusing optical system 140 is shifted from and parallel to an optical axis 121A of the collimator lens 121. For example, the optical axis 141A of the focusing lens 141 is shifted in the −Z-axis direction from the optical axis 121A of the collimator lens 121. The SLM 150 is arranged on the optical axis 141A of the focusing optical system 140. The pieces of light that have transmitted through the dispersive optical element 130 may be concentrated on a point of intersection between the optical axis 141A of the focusing optical system 140 and the SLM 150.

In the comparative example, a reflective plane of the SLM 150 has a conjugate relationship with the incident slit 110 and the output slit 160 and is vertical to the optical axis 141A of the focusing lens 141. However, in the spectrometer 101, dispersed pieces of light only reflected from the vicinity of a center of the SLM 150 are in focus. That is, dispersed pieces of light reflected from other than the vicinity of the center of the SLM 150 are out of focus. Therefore, in the comparative example, spectral performance cannot be improved due to out-of-focus.

Next, effects of example embodiment 1 are described. Compared with the comparative example shown in FIGS. 10 and 11, in the spectrometer 1 according to embodiment 1, dispersed pieces of light are in focus on the entire surface of the DMD 50, and light may be perpendicularly incident to the mirror surface 54 of each pixel mirror 53 of the DMD 50. Therefore, light that has passed through the incident slit 10 may be spectrally dispersed with a high resolution. Accordingly, the light use efficiency and the spectral performance of the spectrometer 1 may be improved.

In addition, according to example embodiment 1, the practical spectrometer 1 using the DMD 50 may be implemented. Particularly, compared with an existing spectrometer in which a refraction grating or a dispersion prism is mechanically rotated, wavelength conversion is faster 1000 times or more. In addition, in wavelength conversions that differ by 100 nm or more, wavelength conversion may be faster 10000 times or more. In addition, a plurality of wavelengths may be simultaneously processed, and a measuring time using an image detector may be significantly (two times or more) reduced. By doing this, a throughput in a metrology system including a semiconductor metrology device may be improved.

MODIFIED EXAMPLE

Figure 12:
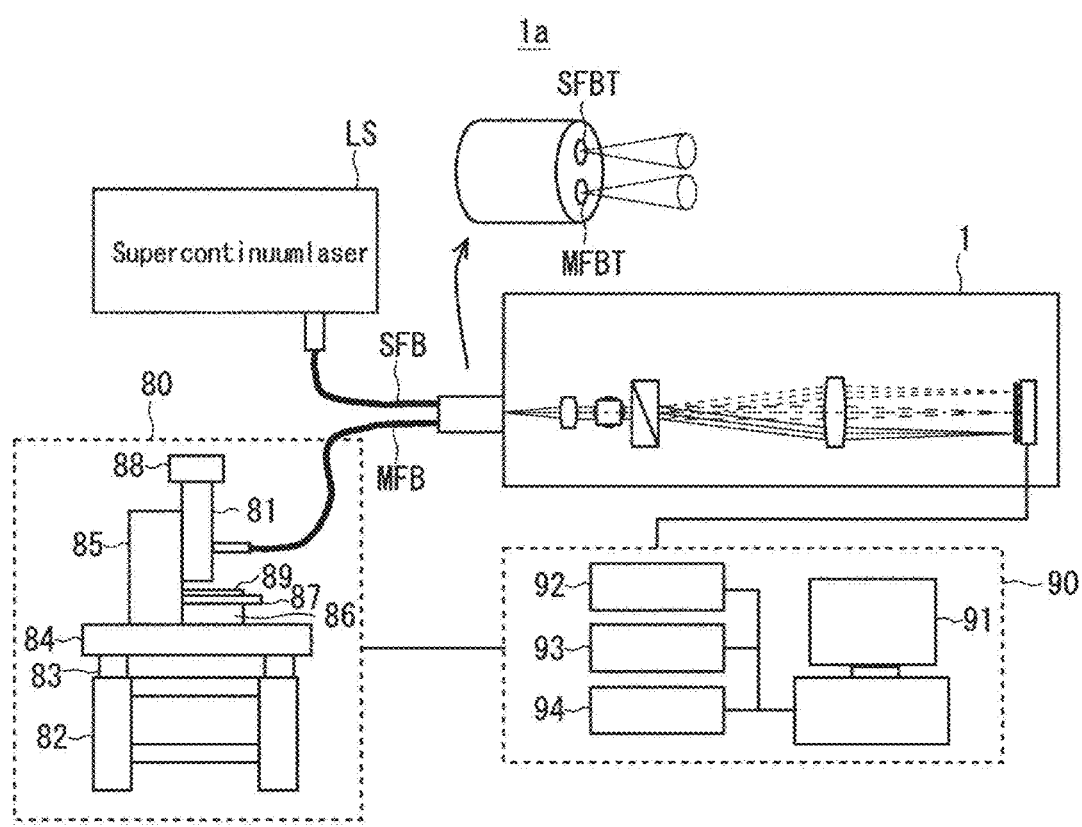
FIG. 12 illustrates a metrology system according to a modified example of embodiment 1.

Next, as a modified example, an example in which the spectrometer 1 according to example embodiment 1 is applied to a metrology system including a semiconductor inspection device and a semiconductor metrology device, such as a semiconductor measurement device, is described. FIG. 12 illustrates a metrology system 1a according to a modified example of embodiment 1. As shown in FIG. 12, the metrology system 1a may include a light source LS, the spectrometer 1, a semiconductor metrology device 80, and a processing device 90. The metrology system 1a according to the modified embodiment may use spectral ellipsometry as a principle.

The light source LS includes, for example, an SC laser. The light source LS is connected to a single-mode fiber SFB. Light generated by the light source LS is output from a single-mode fiber cross-section SFBT through the single-mode fiber SFB. The single-mode fiber cross-section SFBT is typically about φ4 μm to about φ5 μm. The single-mode fiber cross-section SFBT may also act as the incident slit 10 of the spectrometer 1. As described above, light may include laser light output from a fiber, and the incident slit 10 may include a cross-section of the fiber.

The spectrometer 1 disperses incident light and outputs light of a desired wavelength from the output slit 60 as output light. The light output from the spectrometer 1 is incident to a multi-mode fiber MFB. In addition, a multi-mode fiber cross-section MFBT, which is an entrance of the multi-mode fiber MFB, may also act as the output slit 60 of the spectrometer 1. Spectrally dispersed light incident to the multi-mode fiber cross-section MFBT is incident to an optical system 81 in the semiconductor metrology device 80 through the multi-mode fiber MFB. In addition, the spectrally dispersed light is used for required measurement or inspection.

The semiconductor metrology device 80 inspects or measures a sample 89 by using light output from the spectrometer 1. The sample 89 is, for example, a semiconductor, such as a semiconductor substrate or a semiconductor circuit. Alternatively, the sample 89 may be a member other than a semiconductor. The semiconductor metrology device 80 may include the optical system 81 and an image detector 88. The semiconductor metrology device 80 may further include a base 82, an isolator 83, an optical table 84, a frame 85, a stage 86, and a wafer holder 87.

The optical system 81 may be mounted on the frame 85, and the frame 85 may be fixed to the optical table 84. The optical table 84 may be above the base 82. The isolator 83 may be between the optical table 84 and the base 82. The stage 86 may drive the wafer holder 87 supporting the sample 89. The wafer holder 87 holding the sample 89 may be on the stage 86. The stage 86 may be under the optical system 81. The semiconductor metrology device 80 photographs the sample 89 by using the optical system 81 and the image detector 88. Accordingly, the sample 89 is inspected or measured.

The processing device 90 includes an information processing device, e.g., a computer 91. In addition, the processing device 90 may further include, for example, a DMD controller 92, an image detector controller 93, and a stage controller 94 besides the computer 91. The DMD controller 92 controls an operation of the DMD 50. The image detector controller 93 controls an operation of the image detector 88. The stage controller 94 controls an operation of the stage 86.

The semiconductor metrology device 80 may inspect or measure the sample 89 by independently using light including a plurality of wavelengths output from the spectrometer 1. In addition, the semiconductor metrology device 80 may carry out ellipsometry metrology from interference fringes obtained by making pieces of light of different polarization components among pieces of light reflected from the sample 89 interfere with each other. In addition, the semiconductor metrology device 80 may carry out ellipsometry metrology by separating light information of a plurality of wavelengths from frequency components of the interference fringes. This is described below.

Embodiment 2

Next, a spectrometer 2 according to example embodiment 2 is described with reference to FIGS. 13 and 14. The spectrometer 2 according to embodiment 2 divides optical paths of incident light and output light in the XZ plane by pupil division. In addition, on the mirror surface 54 of each pixel mirror 53 of the DMD 50, a central-axis incident angle of incident light is the same as a central-axis output angle of output light. Accordingly, in the collimator optical system 20, light use efficiency may be further improved even without using the beam splitter 22.

Figure 13:
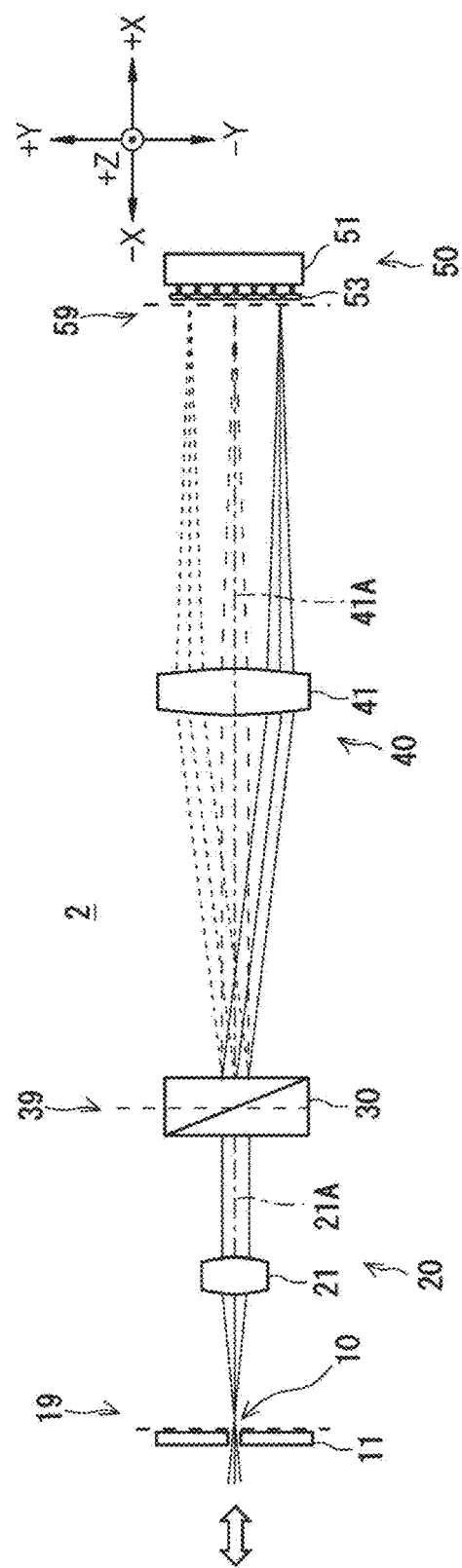
FIG. 13 illustrates a spectrometer according to example embodiment 2.
Figure 14:
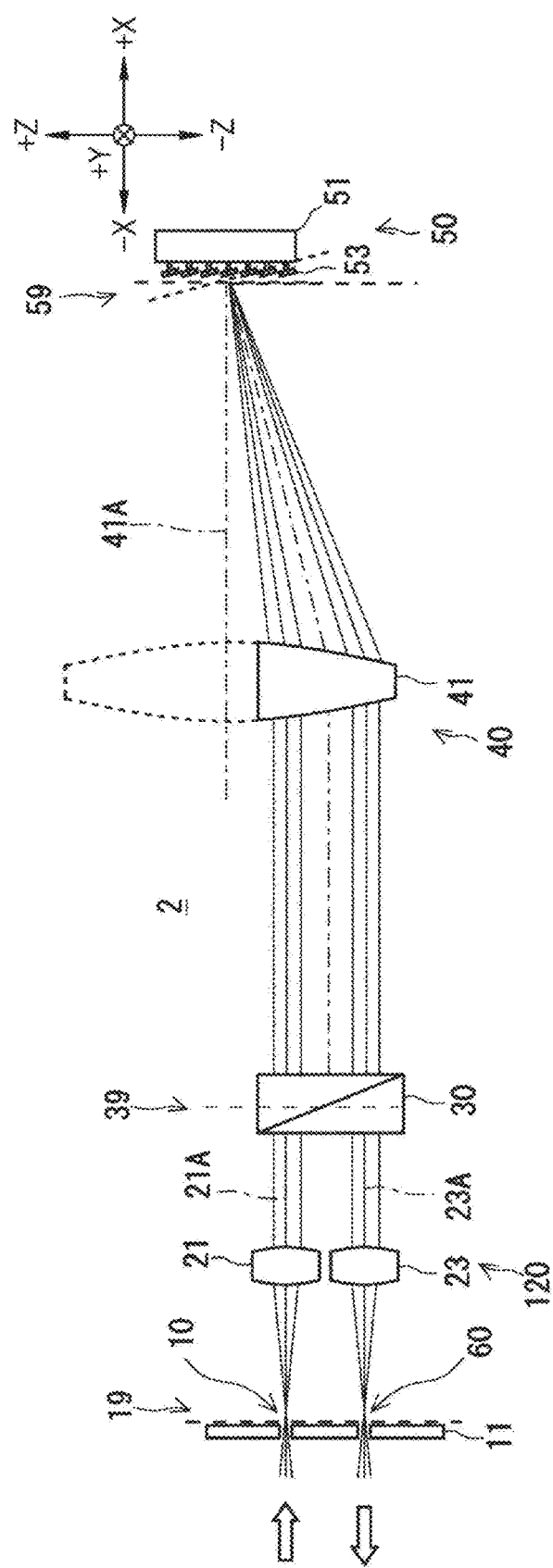
FIG. 14 illustrates the spectrometer according to example embodiment 2.
Figure 15:
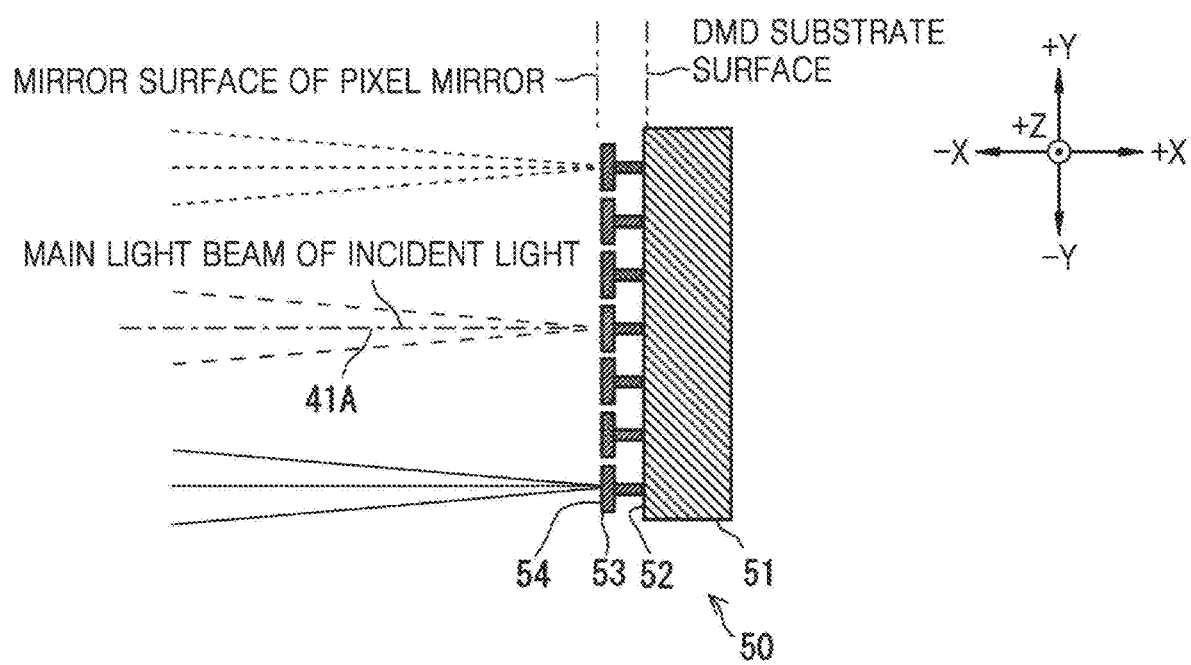
FIG. 15 is a cross-sectional view of a DMD in the spectrometer according to example embodiment 2.
Figure 16:
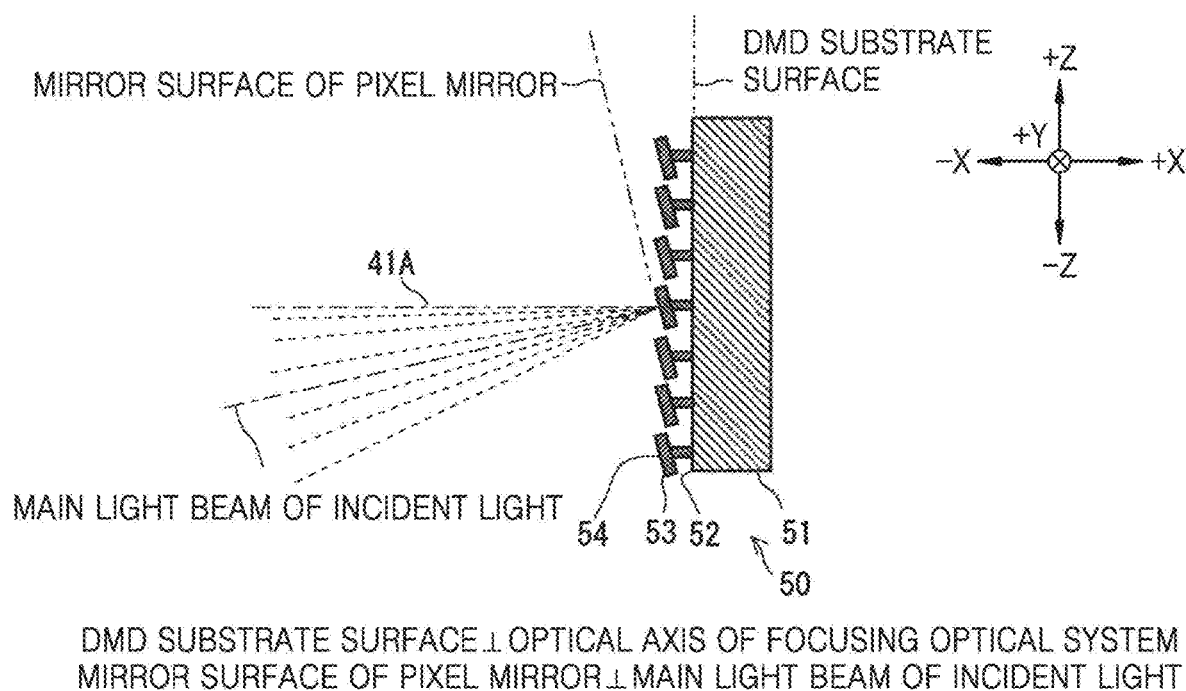
FIG. 16 is a cross-sectional view of the DMD in the spectrometer according to example embodiment 2.

FIGS. 13 and 14 illustrate the spectrometer 2 according to example embodiment 2. FIG. 13 illustrates an arrangement of each component in the XY plane, which is viewed in the Z-axis direction perpendicular to the XY plane. FIG. 14 illustrates an arrangement of each component in the XZ plane, which is viewed in the Y-axis direction. FIGS. 15 and 16 are cross-sectional views illustrating the DMD 50 in the spectrometer 2 according to embodiment 2. FIG. 15 is a cross-sectional view of the DMD 50, which is perpendicular to the Z-axis direction. FIG. 16 is a cross-sectional view of the DMD 50, which is perpendicular to the Y-axis direction.

As shown in FIGS. 13 to 16, in the spectrometer 2 according to example embodiment 2, on the XZ plane, a central-axis incident angle of light incident to the mirror surface 54 is the same as a central-axis reflective angle of light reflected from the mirror surface 54.

The incident slit 10 passes therethrough light generated by a light source and guides the light to the collimator optical system 20. In the spectrometer 2 according to example embodiment 2, the collimator optical system 20 may include the collimator lens 21 and the collimator lens 23. The collimator optical system 20 according to embodiment 2 does not include the beam splitter 22. The collimator lens 21 converts, into parallel pieces of light, light that has passed through the incident slit 10. The parallel pieces of light converted by the collimator lens 21 are incident to the dispersive optical element 30.

The dispersive optical element 30 disperses, at different angles according to wavelengths, the parallel pieces of light converted by the collimator lens 21. The focusing optical system 40 includes the focusing lens 41. The focusing lens 41 focuses the dispersed pieces of light. For example, as shown in FIG. 13, in the XY surface including the dispersion direction, the focusing lens 41 focuses, on the DMD 50, pieces of light dispersed according to wavelengths. In addition, as shown in FIG. 14, in the XZ plane, the focusing lens 41 focuses, on the DMD 50, pieces of light that have transmitted through the dispersive optical element 30.

According to example embodiment 2, the focusing lens 41 inputs light to the DMD 50 so that a central axis of the light incident to the DMD 50 has an incident angle with respect to the mirror surface 54 of the DMD 50. Accordingly, a central-axis incident angle of light incident to the mirror surface 54 of the DMD 50 is the same as a central-axis reflective angle of light reflected from the mirror surface 54.

As shown in FIG. 15, on a cross-section of the XY plane including the dispersion direction, the substrate surface 52 (for example, a cutting plane line thereof) of the substrate 51 is parallel to the mirror surface 54 (for example, a cutting plane line thereof) of the pixel mirror 53. The substrate surface 52 (for example, a cutting plane line thereof) and the mirror surface 54 (for example, a cutting plane line thereof) are substantially perpendicular to a central axis of incident light. By this arrangement, on the XY plane, focuses at all dispersed wavelengths are on the mirror surface 54. Therefore, spectral performance may be improved.

As shown in FIG. 16, in a cross-section of the XZ plane perpendicular to the dispersion direction, the substrate surface 52 of the substrate 51 is perpendicular to the optical axis 41A of the focusing optical system 40. The mirror surface 54 of the pixel mirror 53 may be perpendicular to a main light beam of incident light. Accordingly, on the XZ plane, a central-axis incident angle of light incident to the mirror surface 54 of each pixel mirror 53 is the same as a central-axis reflective angle of light reflected from the mirror surface 54. By this arrangement, in the XZ plane, a focus is also on the mirror surface 54 of the pixel mirror 53. Therefore, light use efficiency and spectral performance may be improved.

Light reflected from the DMD 50 is output from the output slit 60 through the focusing lens 41 and the dispersive optical element 30. Particularly, the reflected light is output from the spectrometer 2 by transmitting through the focusing lens 41 and the dispersive optical element 30 and passing through the collimator lens 23 and the output slit 60. However, an optical axis 23A of the collimator lens 23 is shifted from the optical axis 21A of the collimator lens 21 in the −Z-axis direction. Therefore, light that has transmitted through the collimator lens 23 is separated in the −Z-axis direction from an optical path of incident light traveling toward the dispersive optical element 30 and the focusing lens 41 by transmitting through the collimator lens 21. Even in this case, the spectrometer 2 according to embodiment 2 includes a retro arrangement.

As shown in FIG. 15, in the XY plane including the dispersion direction, wavelength-specific images of the incident slit 10, to which light is incident, are formed on the DMD 50. Pieces of light reflected from the DMD 50 offset wavelength dispersion by transmitting through the same dispersive optical element 30 again. Therefore, an image of the incident slit 10 is formed at the same position regardless of wavelengths. Therefore, the output slit 60 is arranged at the position where the image of the incident slit 10 is formed.

As shown in FIG. 16, in the XZ plane perpendicular to the dispersion direction, the DMD 50 is arranged on the optical axis 41A of the focusing lens 41, which is shifted from the optical axis 21A of the collimator lens 21. Therefore, the optical axis 41A of the focusing lens 41 is perpendicular to the substrate surface 52 of the DMD 50.

In the spectrometer 2 according to example embodiment 2, focuses of pieces of light dispersed according to wavelengths are also on the mirror surface 54. Therefore, spectral performance may be improved. In addition, in the collimator optical system 20, the beam splitter 22 may not be required. Other configuration and effects are included in the description of embodiment 1.

Embodiment 3

Next, a spectrometer 3 according to example embodiment 3 is described with reference to FIGS. 17 and 18. In the spectrometer 3 according to embodiment 3, the focusing lens 41 is obliquely arranged with respect to parallel pieces of light that have transmitted through the dispersive optical element 30 instead that the optical axis 41A of the focusing lens 41 is shifted from the optical axis 21A of the collimator lens 21. In a configuration according to embodiment 3, focuses of pieces of light dispersed according to wavelengths are on the mirror surface 54.

Figure 17:
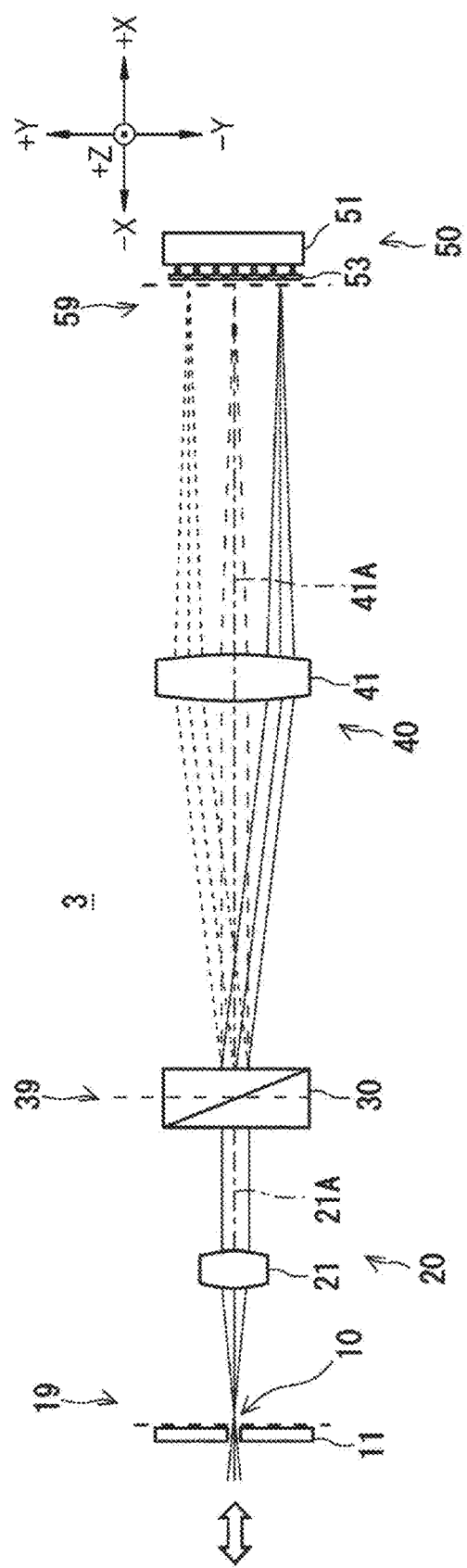
FIG. 17 illustrates a spectrometer according to example embodiment 3.
Figure 18:
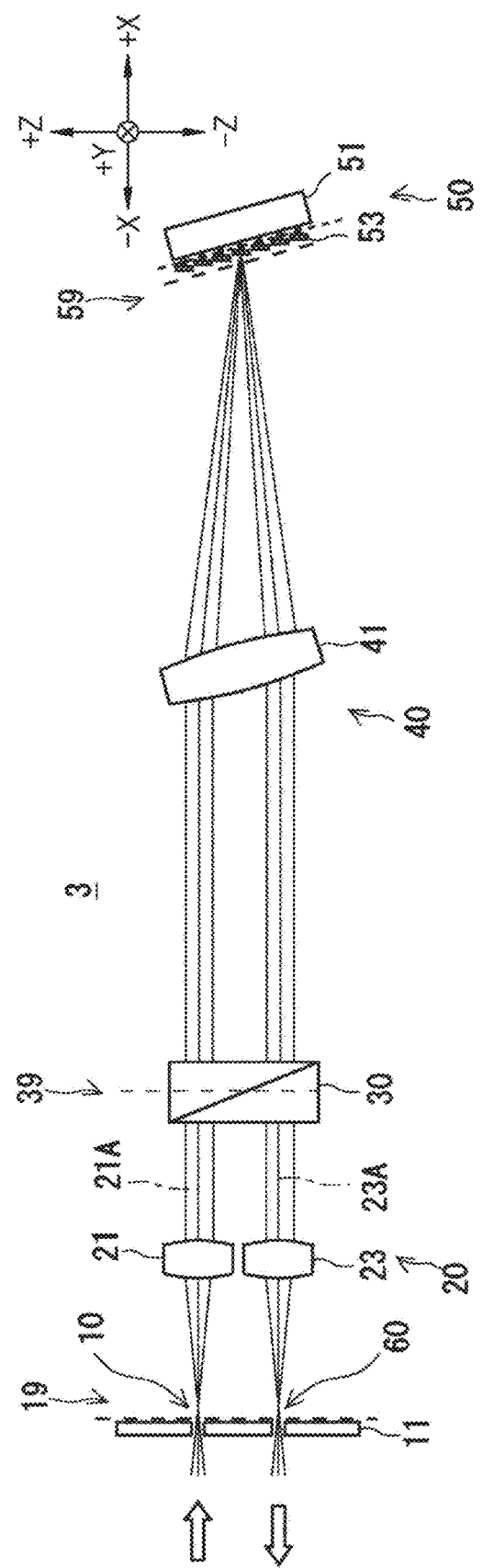
FIG. 18 illustrates the spectrometer according to example embodiment 3.
Figure 19:
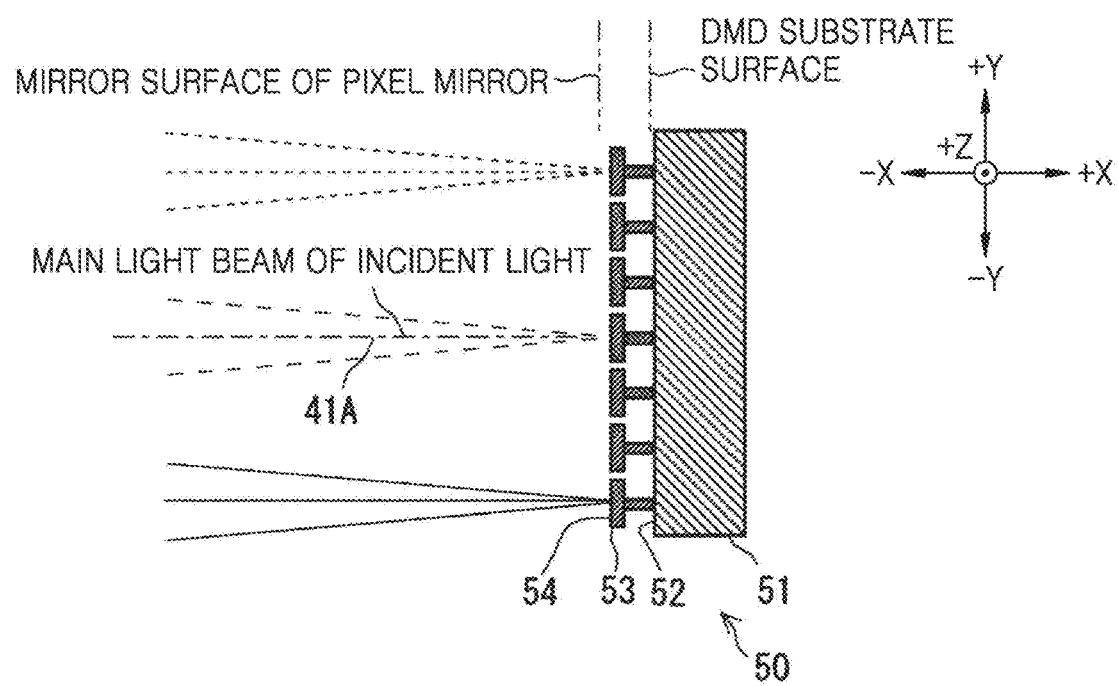
FIG. 19 is a cross-sectional view of a DMD in the spectrometer according to example embodiment 3.
Figure 20:
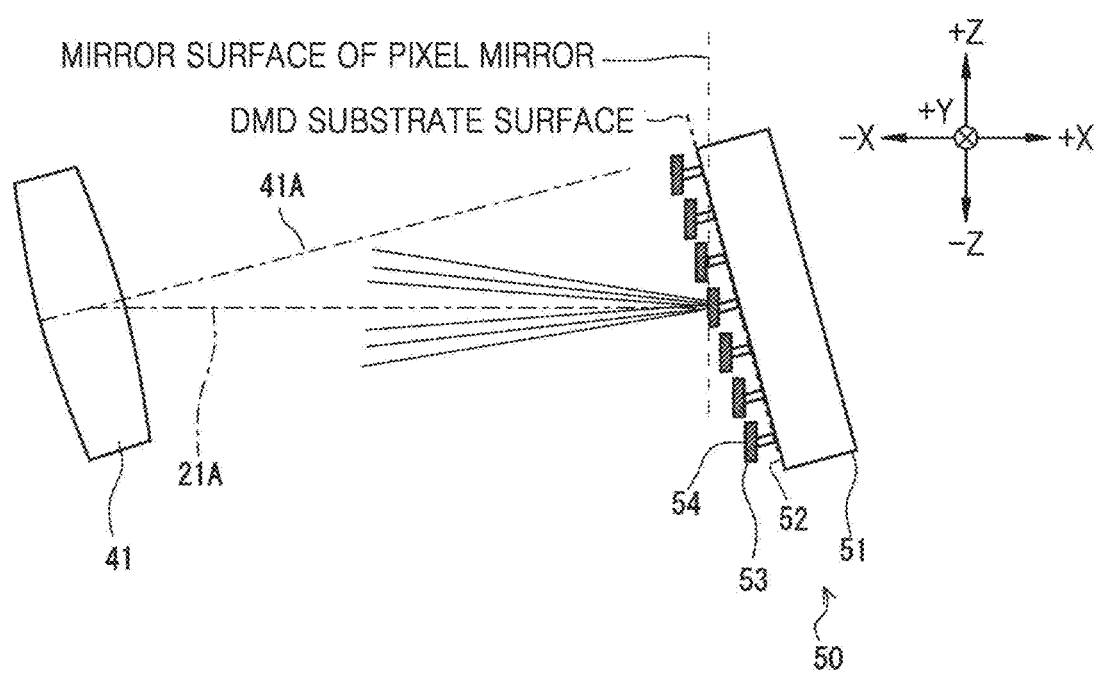
FIG. 20 is a cross-sectional view of the DMD in the spectrometer according to example embodiment 3.

FIGS. 17 and 18 illustrate the spectrometer 3 according to example embodiment 3. FIG. 17 illustrates an arrangement of each component in the XY plane, which is viewed in the Z-axis direction perpendicular to the XY plane. FIG. 18 illustrates an arrangement of each component in the XZ plane, which is viewed in the Y-axis direction. FIGS. 19 and 20 are cross-sectional views illustrating the DMD 50 in the spectrometer 3 according to embodiment 3. FIG. 19 is a cross-sectional view of the DMD 50, which is perpendicular to the Z-axis direction. FIG. 20 is a cross-sectional view of the DMD 50, which is perpendicular to the Y-axis direction.

As shown in FIGS. 17 to 20, the optical axis 41A of the focusing lens 41 is inclined with respect to the optical axis 21A of the collimator lens 21. Particularly, the optical axis 41A of the focusing lens 41 and the optical axis 21A of the collimator lens 21 are in the XZ plane. The optical axis 41A of the focusing lens 41 and the optical axis 21A of the collimator lens 21 intersect with each other in the XZ plane. In addition, on the XZ plane, a central-axis incident angle of light incident to the mirror surface 54 is the same as a central-axis reflective angle of light reflected from the mirror surface 54.

The incident slit 10 passes therethrough light generated by a light source and guides the light to the collimator optical system 20. The collimator lens 21 of the collimator optical system 20 converts, into parallel pieces of light, light that has passed through the incident slit 10. The parallel pieces of light generated by the collimator lens 21 are incident to the dispersive optical element 30.

The dispersive optical element 30 disperses, at different angles according to wavelengths, the parallel pieces of light converted by the collimator lens 21. The focusing lens 41 of the focusing optical system 40 focuses the dispersed pieces of light. For example, as shown in FIG. 17, in the XY surface including the dispersion direction, the focusing lens 41 focuses, on the DMD 50, pieces of light dispersed according to wavelengths. In addition, as shown in FIG. 18, in the XZ plane, the focusing lens 41 focuses, on the DMD 50, pieces of light that have transmitted through the dispersive optical element 30. A central-axis incident angle of light incident to the DMD 50 is the same as a central-axis reflective angle of light reflected from the mirror surface 54.

As shown in FIG. 19, on the XY plane including the dispersion direction the substrate surface 52 (for example a cutting plane line thereof) of the substrate 51 is parallel to the mirror surface 54 (for example, a cutting plane line thereof) of the pixel mirror 53. These cutting plane lines are perpendicular to a main light beam of incident light (a central axis of light). By this arrangement, focuses at all dispersed wavelengths are on the mirror surface 54. Therefore, spectral performance may be improved.

As shown in FIG. 20, in a cross-section of the XZ plane perpendicular to the dispersion direction, the substrate surface 52 of the substrate 51 is perpendicular to the optical axis 41A of the focusing optical system 40. On the XZ plane, a central-axis incident angle of light incident to the mirror surface 54 of each pixel mirror 53 is the same as a central-axis reflective angle of light reflected from the mirror surface 54. By the arrangement according to embodiment 3, in the XZ plane, a focus is also on the mirror surface 54 of each pixel mirror 53 of the DMD 50. Therefore, light use efficiency and spectral performance may be improved.

Light reflected from the DMD 50 is output from the output slit 60 through the focusing lens 41 and the dispersive optical element 30. Particularly, the reflected light is output from a monochromator by transmitting through the focusing lens 41 and the dispersive optical element 30 and passing through the collimator lens 23 of the collimator optical system 20 and the output slit 60. However, an optical path of output light is separated in the −Z-axis direction from incident light traveling toward the dispersive optical element 30 and the focusing lens 41 by transmitting through the collimator lens 21. Even in this case, the spectrometer 3 according to embodiment 3 includes a retro arrangement.

Even in example embodiment 3, the substrate surface 52 of the substrate 51 is perpendicular to the optical axis 41A of the focusing optical system 40. In addition, a central-axis incident angle of light incident to the mirror surface 54 of each pixel mirror 53 is the same as a central-axis reflective angle of light reflected from the mirror surface 54. Therefore, focuses of pieces of light of all dispersed wavelengths are on the mirror surface 54. Therefore, light use efficiency and spectral performance may be improved. Other configuration and effects are included in the description of embodiments 1 and 2.

Embodiment 4

Next, a spectrometer 4 according to example embodiment 4 is described with reference to FIGS. 21 and 22. In the spectrometer 4 according to embodiment 4, a stair-shaped prism is between the collimator optical system 20 and the dispersive optical element 30.

Figure 21:
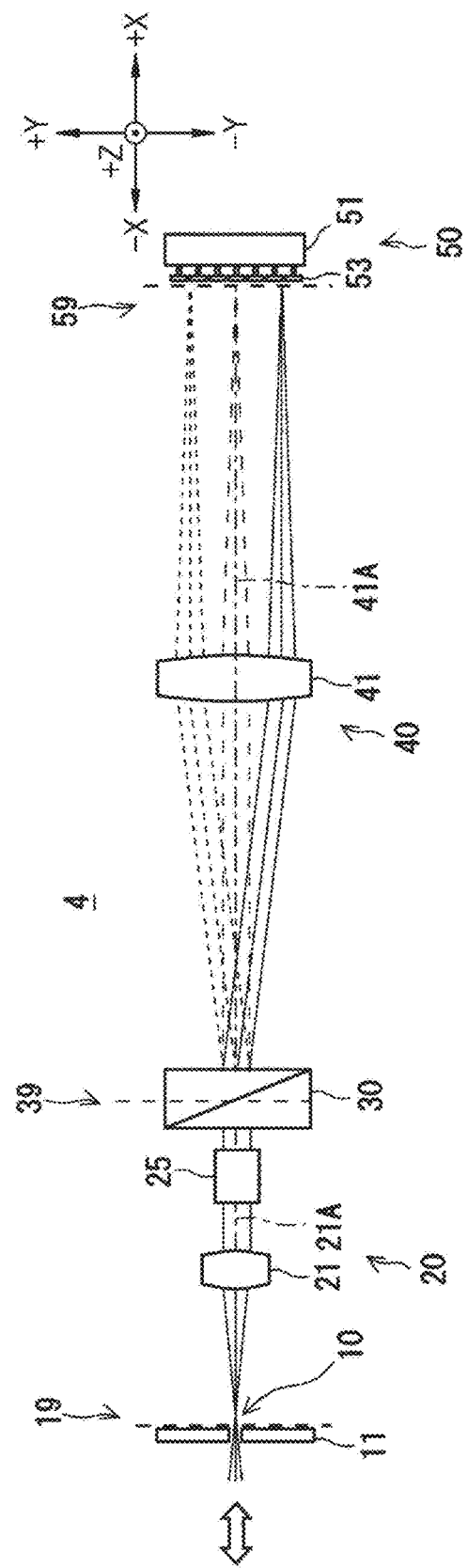
FIG. 21 illustrates a spectrometer according to example embodiment 4.
Figure 22:
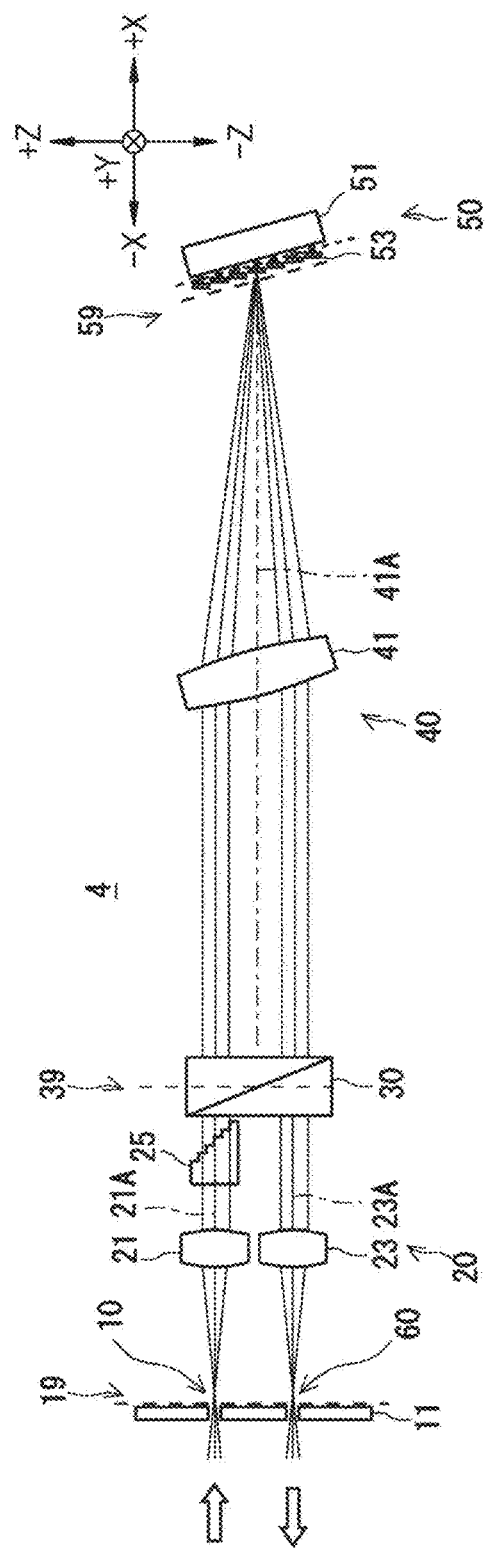
FIG. 22 illustrates the spectrometer according to example embodiment 4.

FIGS. 21 and 22 illustrate the spectrometer 4 according to example embodiment 4. FIG. 21 illustrates an arrangement of each component in the XY plane, which is viewed in the Z-axis direction perpendicular to the XY plane. FIG. 22 illustrates an arrangement of each component in the XZ plane, which is viewed in the Y-axis direction.

As shown in FIGS. 21 and 22, an optical member 25 is between the collimator optical system 20 and the dispersive optical element 30. The optical member 25 splits incident light and imparts an optical path difference between the split pieces of light. The optical member 25 may be referred to as a spatial retarder. One example of the optical member 25 includes a stair-shaped prism.

The spectrometer 4 according to example embodiment 4 includes the optical member 25 configured to impart an optical path difference. Therefore, even when a light source, such as an SC laser, having a high spatial coherency is used, the spatial coherency may be reduced by imparting, between pieces of light split by the optical member 25, an optical path difference greater than or equal to a distance causing interference.

In addition, in an operation of the spectrometer 4, instead of switching, to the ON state, all pixel mirrors 53 at a part on the substrate surface 52 of the DMD 50 on which incident pieces of light are reflected, the DMD 50 is driven to randomly arrange about half of the pixel mirrors 53 to reflect incident light (e.g., switching to the ON state), and also change the random arrangement along time. That is, as shown in FIG. 9, the DMD 50 randomly switches each pixel mirror 53 of the extraction wavelength column 56 to the ON state or the OFF state. This operation is implemented by software of the computer 91 and the DMD controller 92 of FIG. 12. Accordingly, when a white laser, such as an SC laser, is used as a light source, the occurrence of speckles may be reduced, and the quality of light, as illumination light, used in the semiconductor metrology device 80 may be improved. Other configuration and effects are included in the description of embodiments 1 to 3.

Embodiment 5

Next, a metrology system 5 according to example embodiment 5 is described. Embodiment 5 relates to the metrology system 5 in which any one of the spectrometers 1, 2, 3, and 4 described above is applied to the semiconductor metrology device 80 having self-interference ellipsometry as a principle.

Figure 23:
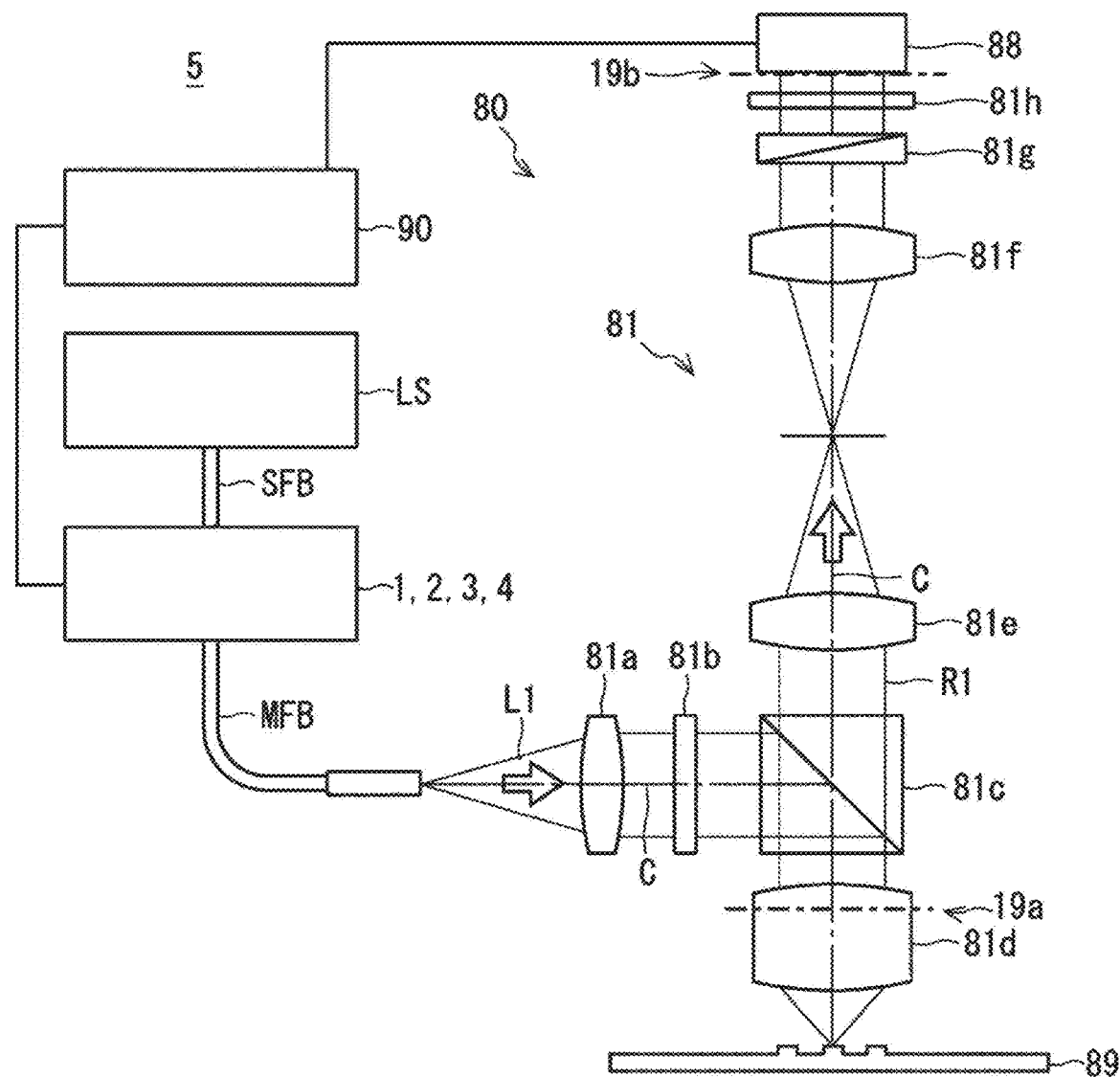
FIG. 23 illustrates a metrology system according to example embodiment 5.

FIG. 23 illustrates the metrology system 5 according to example embodiment 5. As shown in FIG. 23, the metrology system 5 may include the light source LS, such as an SC laser, any one of the spectrometers 1, 2, 3, and 4, the semiconductor metrology device 80, and the processing device 90. The metrology system 5 measures ellipsometry coefficients $\Psi$ and $\Delta$ by emitting illumination light L1 on the sample 89 and receiving reflective light R1 reflected from the sample 89.

The optical system 81 may include an illumination lens 81*a*, a polarizer 81*b*, a beam splitter 81*c*, an objective lens 81*d*, relay lenses 81*e* and 81*f*, a polarizing optical element 81*g*, an analyzer 81*h*, and the image detector 88. The analyzer 81*h* includes, for example, a polarizing plate. The image detector 88 includes, for example, a camera.

The optical system 81 illuminates the sample 89, such as a semiconductor, with the illumination light L1 including linearly polarized light. In addition, the optical system 81 concentrates the reflective light R1 reflected from the sample 89 after emitting the illumination light L1 on the sample 89. Particularly, the illumination lens 81*a* emits the illumination light L1 on the polarizer 81*b*. For example, the illumination lens 81*a* converts, into parallel pieces of light, the illumination light L1 output from the multi-mode fiber MFB. In addition, the illumination light L1 converted into the parallel pieces of light is incident to the polarizer 81*b*.

The polarizer 81*b* transmits therethrough the illumination light L1 including one-directional linearly polarized light. For example, the polarizer 81*b* outputs, to the beam splitter 81*c*, the illumination light L1 of the linearly polarized light of which a polarization direction is inclined at 45 degrees with respect to the ground. The beam splitter 81*c* reflects a portion of the illumination light L1 incident thereto and transmits therethrough the other portion of the illumination light L1. The beam splitter 81*c* reflects the portion of the illumination light L1 incident thereto toward the objective lens 81*d*. The illumination light L1 reflected from the beam splitter 81*c* is incident to the objective lens 81*d*.

The objective lens 81*d* illuminates the sample 89 with the illumination light L1 including the linearly polarized light. The objective lens 81*d* illuminates the sample 89 by concentrating, in a dot shape, the illumination light L1 reflected from the beam splitter 81*c*. In addition, the objective lens 81*d* transmits therethrough the reflective light R1 reflected from the sample 89 after emitting the illumination light L1 on the sample 89. In the metrology system 5 according to embodiment 5, an optical axis C of the illumination light L1 incident to the sample 89 the optical axis C of the reflective light R1 reflected from the sample 89 are perpendicular to a measurement plane of the sample 89.

The illumination light L1 illuminating the sample 89 includes one-directional linearly polarized light. The illumination light L1 including one-directional linearly polarized light is concentrated on and incident to the measurement plane of the sample 89. Therefore, when the illumination light L1 is completely polarized light and linearly polarized light, and the optical axis C is perpendicular to the measurement plane of the sample 89, the illumination light L1 may include a P polarization component and an S polarization component according to an azimuth at which the illumination light L1 is incident to the measurement plane. The S polarization component of the illumination light L1 is reflected as S polarized light. The P polarization component of the illumination light L1 is reflected as P polarized light.

The objective lens 81*d* transmits therethrough the reflective light R1 reflected from the measurement plane of the sample 89 after emitting the illumination light L1 on the sample 89 and inputs the reflective light R1 to the beam splitter 81*c*. The beam splitter 81*c* transmits therethrough a portion of the reflective light R1 incident thereto. For example, the reflective light R1 that has transmitted through the beam splitter 81*c* is incident to the relay lens 81*e*. The relay lens 81*e* concentrates the reflective light R1 that has transmitted through the beam splitter 81*c*, forms an image, and then inputs the reflective light R1 to the relay lens 81*f*. The relay lens 81*f* transmits therethrough the reflective light R1 incident thereto and inputs the reflective light R1 to the polarizing optical element 81*g*.

Figure 24:
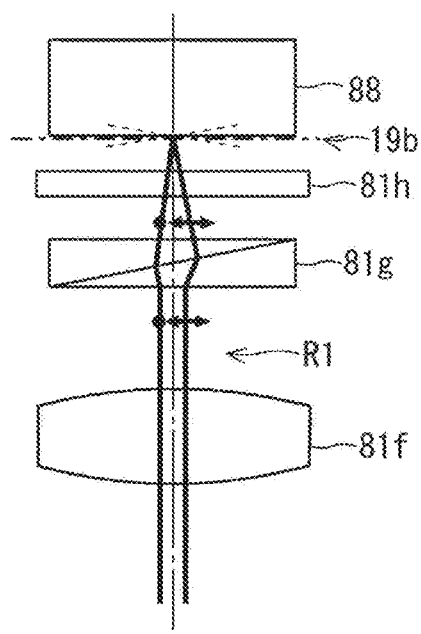
FIG. 24 is a configuration diagram illustrating a polarizing optical element, an analyzer, and an image detector in the metrology system according to example embodiment 5.

FIG. 24 is a configuration diagram illustrating the polarizing optical element 81*g*, the analyzer 81*h*, and the image detector 88 in the metrology system 5 according to example embodiment 5. As shown in FIG. 24, the polarizing optical element 81*g* splits, into two linearly polarized pieces of light having polarization directions perpendicular to each other, the reflective light R1 reflected from the sample 89 and outputs the two linearly polarized pieces of light. The polarizing optical element 81*g* includes, for example, a Nomarski prism.

The polarization directions perpendicular to each other, which are split by the polarizing optical element 81*g*, are assumed as an $\alpha$ direction and a $\beta$ direction. In this case, a plane made by the $\alpha$ direction and the $\beta$ direction is perpendicular to an optical axis of the reflective light R1. Then, the polarizing optical element 81*g* splits the reflective light R1 into linearly polarized light in the $\alpha$ direction and linearly polarized light in the $\beta$ direction. In addition, the polarizing optical element 81*g* biases and outputs the split linearly polarized light in the $\alpha$ direction and linearly polarized light in the $\beta$ direction so that the linearly polarized light in the $\alpha$ direction and linearly polarized light in the $\beta$ direction are converged on the image detector 88 again. In addition, the polarizing optical element 81g is not limited to the Nomarski prism and may include a Wollaston prism or a Rochon prism.

Figure 25:
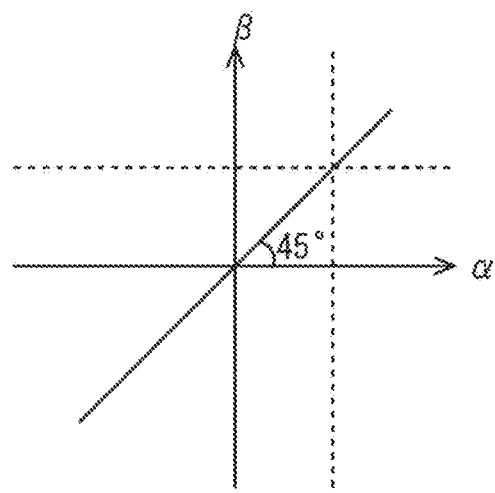
FIG. 25 illustrates linearly polarized light transmitting through the analyzer in the metrology system according to example embodiment 5.

FIG. 25 illustrates linearly polarized light transmitting through the analyzer 81h in the metrology system 5 according to example embodiment 5. As shown in FIG. 25, the analyzer 81h transmits therethrough a linearly polarized light component in α direction inclined at 45 degrees with respect to the polarization direction of the α direction and the polarization direction of the β direction, which are split by the polarizing optical element 81g. Therefore, the analyzer 81h transmits therethrough a polarized light component inclined at 45 degrees with respect to the α direction in linearly polarized light having the polarization direction of the α direction. In addition, the analyzer 81h transmits therethrough a polarized light component inclined at 45 degrees with respect to the β direction in linearly polarized light having the polarization direction of the β direction. Therefore, the two linearly polarized pieces of light perpendicular to each other transmit through the analyzer 81h and are output as the polarized light components polarized in the same direction (the direction inclined at 45 degrees). The reflective light R1 including the polarized light components output from the analyzer 81h is incident to the image detector 88.

The image detector 88 receives the reflective light R1 incident thereto. The image detector 88 is arranged at a pupil conjugate position 19b having a conjugate relationship with a pupil position 19a. The reflective light R1 includes the same directional polarization components of the two linearly polarized pieces of light perpendicular to each other. Therefore, the reflective light R1 interferes on the image detector 88. Accordingly, interference fringes are formed on the image detector 88. The image detector 88 detects an interference fringe of each polarization component that has transmitted through the analyzer 81h.

Figure 26:
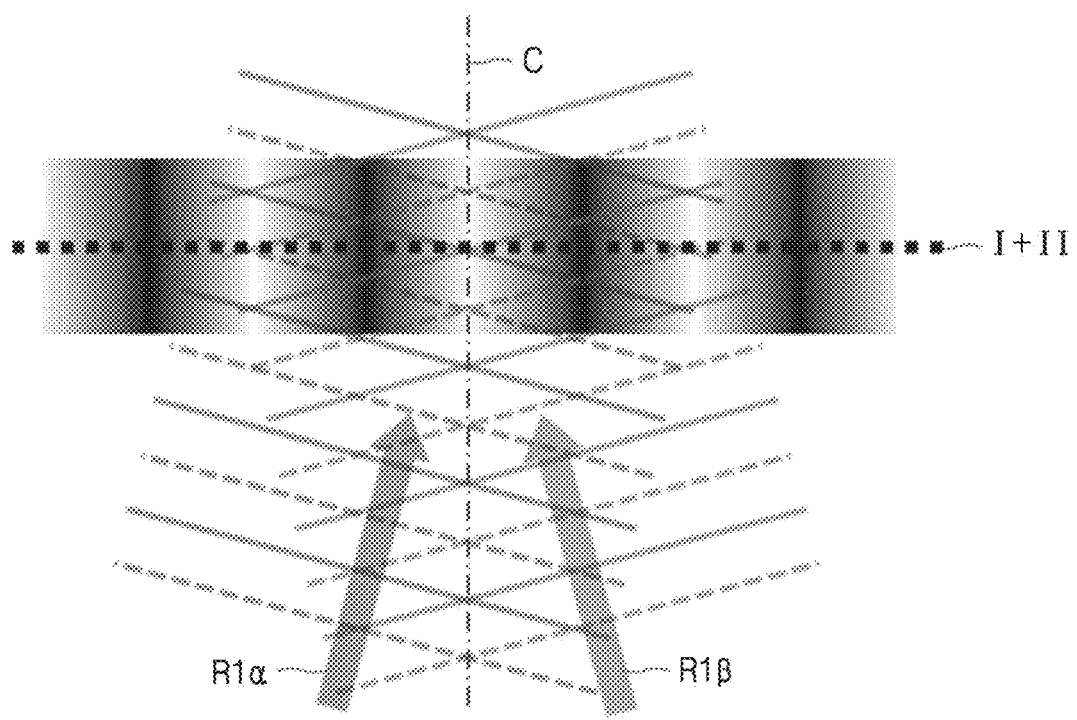
FIG. 26 illustrates a wave surface of each linearly polarized light included in reflective light incident to the image detector in the metrology system according to example embodiment 5.
Figure 27:
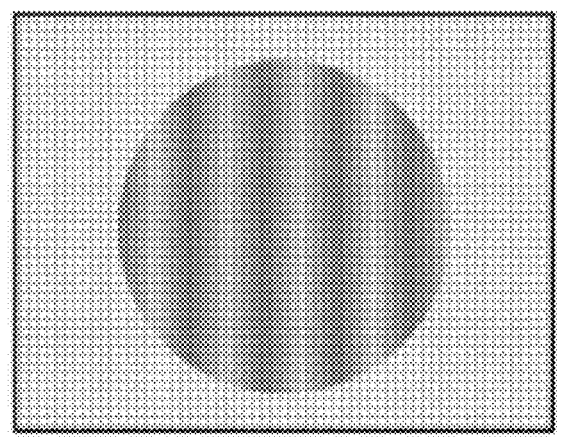
FIG. 27 illustrates interference fringes of reflective light interfered on the image detector in the metrology system according to example embodiment 5.

FIG. 26 illustrates a wave surface of each linearly polarized light included in reflective light incident to the image detector 88 in the metrology system 5 according to example embodiment 5. FIG. 27 illustrates interference fringes of reflective light interfered on the image detector 88 in the metrology system 5 according to embodiment 5. As shown in FIGS. 26 and 27, the reflective light R1 including two linearly polarized pieces of light R1α and R1β split by the polarizing optical element 81g transmits through the analyzer 81h and forms interference fringes on the image detector 88.

The processing device 90 calculates the ellipsometry coefficients Ψ and Δ from the interference fringes detected by the image detector 88. For example, the processing device 90 calculates the ellipsometry coefficients Ψ and Δ by fitting, to equation 1, an intensity distribution $I_{fringe}$ of the reflective light R1 in the interference fringes. Herein, the intensity distribution $I_{fringe}$ is a function of a position on the image detector 88.

[Equation 1]

$$I_{fringe} = \tag{1}$$
$$|E_1|^2 + |E_2|^2 + 2|E_1||E_2|\cos(\delta_1 - \delta_2) = |E_1|^2 + |E_2|^2 + 2|E_1||E_2|\cos\Delta$$

Herein, the ellipsometry coefficient Ψ is calculated by equation 2.

[Equation 2]

$$\psi : \tan^{-1} \frac{|E_1|}{|E_2|} \tag{2}$$

Figure 28:
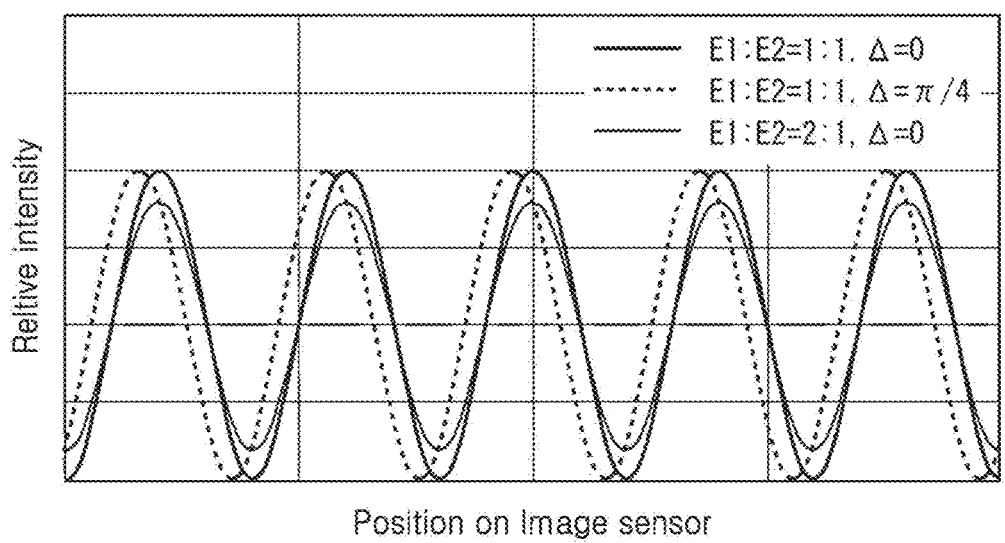
FIG. 28 is a graph illustrating ellipsometry coefficients obtained from the interference fringes on the image detector in the metrology system according to example embodiment 5.

FIG. 28 is a graph illustrating ellipsometry coefficients obtained from the interference fringes on the image detector 88 in the metrology system 5 according to example embodiment 5. As shown in FIG. 28, when an intensity ratio Ψ and a phase difference Δ of two polarized pieces of light are changed, the intensity of the reflective light R1 forming the interference fringes varies at each position on the image detector 88. By using this relationship, the ellipsometry coefficients Ψ and Δ may be obtained from the interference fringes.

For example, for the reflective light R1 having an intensity change indicated by a bold line, the intensity ratio Ψ (E1:E2) and the phase difference Δ of the two polarized pieces of light are 1:1 and 0, respectively. In addition, for the reflective light R1 having an intensity change indicated by a dashed line, the intensity ratio Ψ (E1:E2) and the phase difference Δ of the two polarized pieces of light are 1:1 and π/4, respectively. In addition, for the reflective light R1 having an intensity change indicated by a fine line, the intensity ratio Ψ (E1:E2) and the phase difference Δ of the two polarized pieces of light are 2:1 and 0, respectively. As described above, the optical system 81 allows split linearly polarized pieces of light of respective polarization directions (the α direction and the β direction) to transmit through the analyzer 81h having a transmission axis inclined at 45 degrees so that two linearly polarized light components interfere with each other, and calculates the ellipsometry coefficients Ψ and Δ from interference fringes.

Figure 29:
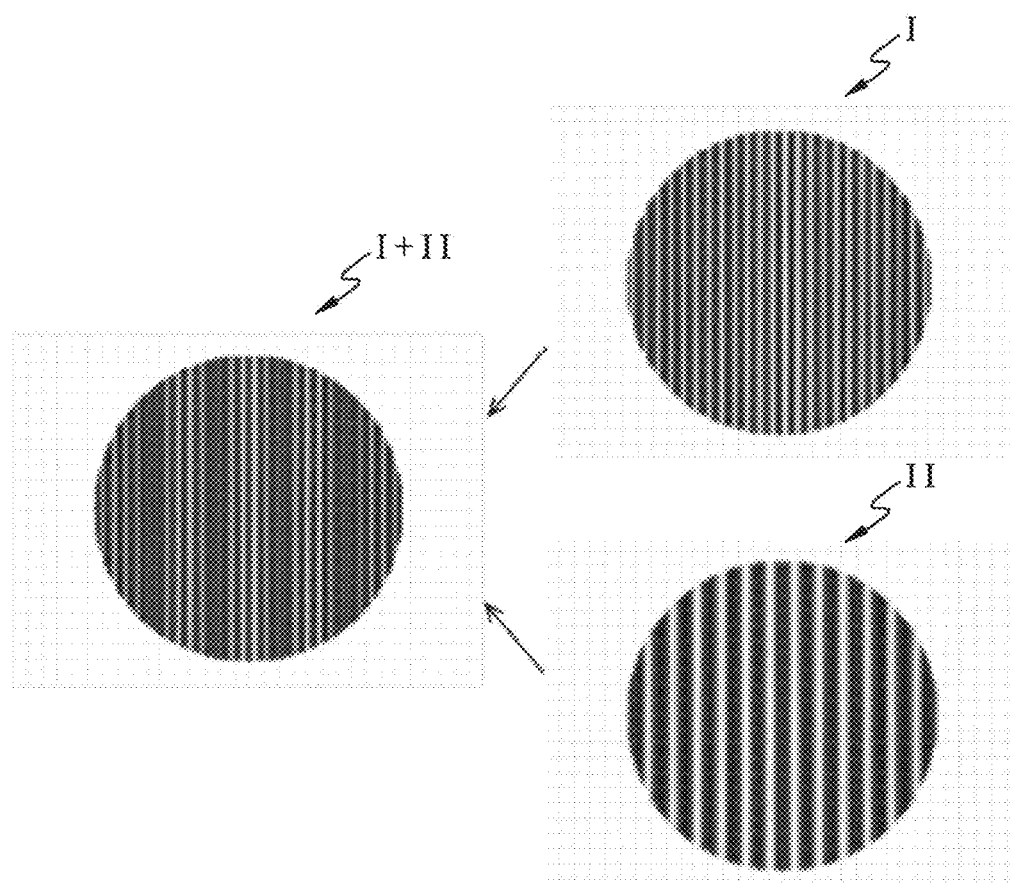
FIG. 29 illustrates interference fringes of reflective light interfered on the image detector in the metrology system according to another example of embodiment 5.

FIG. 29 illustrates interference fringes of reflective light interfered on the image detector 88 in the metrology system 5 according to another example of example embodiment 5. As shown in FIG. 29, the DMD 50 may switch pixel mirrors 53 of extraction wavelength columns 56 corresponding to two wavelengths I and II to the ON state and guide pieces of light including the wavelengths I and II to the semiconductor metrology device 80. In this case, interference fringes are obtained by combining interference fringes of the wavelength I and interference fringes of the wavelength II.

A surface state of the sample 89 is analyzed by obtaining information about an amplitude and a phase of a particular frequency component through Fourier transform on the obtained interference fringes. When pieces of light of two wavelengths are simultaneously incident, interference fringes by the pieces of light of the two wavelengths may be simultaneously analyzed by preparing two window functions in Fourier transform.

Next, effects of example embodiment 5 are described. The metrology system 5 according to embodiment 5 uses the polarizing optical element 81g to measure the ellipsometry coefficients Ψ and Δ. The polarizing optical element 81g split the reflective light R1 reflected from the sample 89 into the two linearly polarized pieces of light R1α and R1β of polarization directions perpendicular to each other and forms, on the image detector 88, interference fringes from the split two linearly polarized pieces of light R1α and R1β. From measurement results of a contrast and a phase of the interference fringes, the ellipsometry coefficients Ψ and Δ that are two independent parameters are directly measured. Accordingly, existing measurement of the intensities of at least four time-series polarization components by using a rotating polarizer or compensator is unnecessary to measure the ellipsometry coefficients Ψ and Δ.

In addition, according to the related art, Stokes parameters are obtained from the intensities of a plurality of pieces of light in different polarization states, and then the ellipsometry coefficients Ψ and Δ are obtained from the obtained Stokes parameters. According to example embodiment 5, the ellipsometry coefficients Ψ and Δ may be obtained directly and from a single image. Therefore, because the ellipsometry coefficients Ψ and Δ may be measured within a short time, a throughput of optical critical dimension (OCD) measurement may be improved.

In addition, when compared with the existing ellipsometer, a driver or an actuator is not included, and thus, the ellipsometry coefficients Ψ and Δ may be more stably measured.

In addition, in many ellipsometers used in an OCD measurement device, an incident angle of the illumination light L1 incident to the surface of the sample 89 is fixed to a Brewster's angle. However, according to embodiment 5, the ellipsometry coefficients Ψ and Δ may be measured at a random incident angle and incident azimuth by locating the image detector 88 at a pupil conjugate position in conjugate with a pupil position of the objective lens 81*d* of a large numerical aperture (NA). This configuration cannot be easily implemented from the existing ellipsometer configured to rotate an analyzer or the like.

As a result, for example, in fitting to a fine structure model on a wafer, metrology results under more conditions may be used, and coupling of different dimensions, which has frequently caused problems in an OCD measurement device, is also reduced, and thus, improvement of precision in metrology of a current semiconductor structure, which has been particularly three-dimensional (3D), is expected. In addition, an illumination area of the sample 89 by the illumination light L1 may be decreased from existing about φ30 μm to about φ1 μm or less, and evaluation of a dimension distribution inside a chip may also be carried out with a higher position resolution. These measurement results may be reflected on lithography, deposition, and etching processes, and a process control of semiconductor manufacturing may be properly carried out. Accordingly, a product yield and productivity in semiconductor manufacturing may be improved.

In addition, in a logic, a test pattern for measuring ellipsometry coefficients, which is arranged inside a semiconductor chip, may be miniaturized to the order of several μm. The size of an existing test pattern is on the order of several tens of μm. Accordingly, an area usable for a circuit in a semiconductor chip may increase, and costs of a semiconductor device may be reduced.

The inventive concepts are not limited to the example embodiments described above and may be properly modified without departing from the spirit and scope of the inventive concepts. For example, the respective configurations of embodiments 1 to 5 may be combined.

Further, regardless of whether numerical values are modified as "about" or "substantially," it will be understood that these values should be construed as including a manufacturing or operational tolerance (e.g., ±10%) around the stated numerical values or shapes.

While the inventive concepts have been particularly shown and described with reference to embodiments thereof, it will be understood that various changes in form and details may be made therein without departing from the spirit and scope of the following claims.

What is claimed is:

1. A spectrometer comprising:
   a first collimator lens configured to generate parallel pieces of light by collimating light that has passed through an incident slit, the first collimator lens having a first optical axis;
   a dispersive optical element configured to generate dispersed pieces of light by dispersing the parallel pieces of light at different angles according to wavelengths;
   a focusing lens configured to generate focused light by focusing the dispersed pieces of light, the focusing lens having a second optical axis that is spaced from and parallel to the first optical axis; and
   a spatial light modulator on the second optical axis and having a reflective plane configured to generate reflective light by reflecting the focused light focused by the focusing lens,
   wherein the reflective light is output through an output slit by passing through the focusing lens, the dispersive optical element and a second collimator lens,
   the incident slit, the output slit, and the reflective plane have a conjugate relationship on a second plane perpendicular to a first plane,
   the first plane includes optical paths of the dispersed pieces of light,
   the second plane includes an optical axis of the first collimator lens and an optical axis of the focusing lens.

2. The spectrometer of claim 1, wherein the optical axis of the focusing lens is shifted from the optical axis of the first collimator lens.

3. The spectrometer of claim 1, wherein the light comprises laser light output from a fiber, and the incident slit comprises a cross-section of the fiber.

4. The spectrometer of claim 1, further comprising:
   an optical member between the first collimator lens and the dispersive optical element and configured to split the collimated light into split collimated pieces of light and cause an optical path difference between the split collimated pieces of light.

5. The spectrometer of claim 4, wherein the optical member comprises a stair-shaped prism.

6. The spectrometer of claim 1, wherein the spatial light modulator comprises a digital micromirror device comprising a plate-shaped substrate and a plurality of pixel mirrors arranged in a matrix on a substrate surface of the substrate, and each of the plurality of pixel mirrors comprises a mirror surface that reflects the focused light and a rotary axis that extends in a direction perpendicular to the second plane.

7. The spectrometer of claim 6, wherein, on the second plane, a central axis of the focused light incident to the mirror surface is perpendicular to the mirror surface.

8. The spectrometer of claim 6, wherein, on the second plane, a central-axis incident angle of the focused light incident to the mirror surface is same as a central-axis reflective angle of the light reflected from the mirror surface.

9. The spectrometer of claim 6, wherein the optical axis of the focusing lens is inclined with respect to the optical axis of the first collimator lens, and, on the second plane, a central-axis incident angle of the focused light incident to the mirror surface is same as a central-axis reflective angle of the reflective light reflected from the mirror surface.

10. The spectrometer of claim 6, wherein each of the plurality of pixel mirrors is in one of a first state in which the mirror surface is inclined at a first angle with respect to the substrate surface and a second state in which the mirror surface is inclined at a second angle with respect to the substrate surface.

11. A metrology system comprising:
a spectrometer configured to generate inspection light; and
a semiconductor metrology device configured to inspect a semiconductor by using the inspection light output from the spectrometer,
wherein the spectrometer includes,
a collimator lens configured to generate parallel pieces of light by collimating light that has passed through an incident slit, the first collimator lens having a first optical axis;
a dispersive optical element configured to generate dispersed pieces of light by dispersing the parallel pieces of light at different angles according to wavelengths;
a focusing lens configured to generate focused light by focusing the dispersed pieces of light, the focusing lens having a second optical axis; and
a spatial light modulator on the second optical axis and configured to generate reflective light by reflecting the light focused by the focusing lens,
wherein the spatial light modulator includes,
a substrate having a plate shape; and
a plurality of pixel mirrors in a matrix on a substrate surface of the substrate,
wherein a normal of the substrate surface is parallel to an optical axis of the focusing lens,
a mirror surface of each of the plurality of pixel mirrors is oblique with respect to the substrate surface, and
an optical axis of the collimator lens is oblique with respect to the optical axis of the focusing lens.

12. The metrology system of claim 11, wherein the inspection light comprises a plurality of wavelength components, and the semiconductor metrology device is further configured to inspect the semiconductor by independently using the plurality of wavelength components of the inspection light.

13. The metrology system of claim 11, wherein ellipsometry metrology is carried out from interference fringes obtained by making pieces of light of different polarization components in the inspection light reflected from the semiconductor interfere with each other, and light information of a plurality of wavelength components of the inspection light is separated from frequency components of the interference fringes.

14. The metrology system of claim 11, further comprising:
a polarization optical element configured to split the inspection light reflected from the semiconductor into first polarized light and second polarized light having a polarization direction perpendicular to a polarization direction of the first polarized light.

15. The metrology system of claim 14, further comprising:
an analyzer configured to switch the polarization directions of the first polarized light and the second polarized light so that the first polarized light and the second polarized light are coherent to each other.

16. A spectrometer comprising:
a collimator lens configured to generate parallel pieces of light by collimating light that has passed through an incident slit, the first collimator lens having a first optical axis;
a dispersive optical element configured to generate dispersed pieces of light by dispersing the parallel pieces of light at different angles according to wavelengths;
a focusing lens configured to generate focused light by focusing the dispersed pieces of light, the focusing lens having a second optical axis that is spaced from and parallel to the first optical axis; and
a digital micromirror device on the second optical axis and configured to generate reflective light by reflecting the light focused by the focusing lens,
wherein the digital micromirror device includes,
a substrate having a plate shape; and
a plurality of pixel mirrors in a matrix form on a substrate surface of the substrate,
wherein each of the plurality of pixel mirrors includes a mirror surface reflecting the light and a rotary axis extending in a dispersion direction of the dispersive optical element.

17. The spectrometer of claim 16, wherein the reflective light is output through an output slit by passing by the focusing lens and the dispersive optical element, the incident slit, the output slit, and the mirror surface of each of the plurality of pixel mirrors are conjugate with each other on a second plane perpendicular to a first plane, the first plane includes optical paths of the dispersed pieces of light, and the second plane includes an optical axis of the collimator lens and an optical axis of the focusing lens.

18. The spectrometer of claim 16, wherein a normal of the substrate surface is parallel to an optical axis of the focusing lens.

19. The spectrometer of claim 16, wherein a normal of the substrate surface and an optical axis of the focusing lens are parallel to a traveling direction of the parallel pieces of light.

20. The spectrometer of claim 16, wherein a normal of the substrate surface and an optical axis of the focusing lens are oblique with respect to a traveling direction of the parallel pieces of light.

* * * * *